(12) United States Patent
Imaizumi et al.

(10) Patent No.: US 8,473,232 B2
(45) Date of Patent: Jun. 25, 2013

(54) MEASURING APPARATUS

(75) Inventors: Satoshi Imaizumi, Ueda (JP); Sadanori Miyajima, Ueda (JP); Toshiki Takahashi, Ueda (JP)

(73) Assignee: Hioko Denki Kabushiki Kaisha, Nagano (JP)

( * ) Notice: Subject to any disclaimer, the term of this patent is extended or adjusted under 35 U.S.C. 154(b) by 364 days.

(21) Appl. No.: 13/009,172

(22) Filed: Jan. 19, 2011

(65) Prior Publication Data

US 2011/0184680 A1 Jul. 28, 2011

(30) Foreign Application Priority Data

| Jan. 26, 2010 | (JP) | 2010-014284 |
| Mar. 5, 2010 | (JP) | 2010-048532 |
| Jul. 5, 2010 | (JP) | 2010-152670 |
| Aug. 30, 2010 | (JP) | 2010-192075 |
| Nov. 18, 2010 | (JP) | 2010-257418 |

(51) Int. Cl.
*G01R 25/00* (2006.01)
*G01R 27/28* (2006.01)
*G06F 19/00* (2011.01)

(52) U.S. Cl.
USPC ........... 702/65; 73/856; 324/713; 324/717 H; 702/64; 702/72; 702/75

(58) Field of Classification Search
USPC ....... 702/64, 65, 67, 72, 75; 73/856; 324/658, 324/673, 713, 717 R, 717 H
See application file for complete search history.

(56) References Cited

U.S. PATENT DOCUMENTS

| 4,887,027 A * | 12/1989 | Strasser .................... 324/117 H |
| 7,466,145 B2 | 12/2008 | Yanagisawa |
| 7,530,277 B2 | 5/2009 | Miyasaka et al. |
| 7,834,645 B2 | 11/2010 | Yanagisawa |
| 2009/0322358 A1 | 12/2009 | Imaizumi |

FOREIGN PATENT DOCUMENTS

| JP | 55-90862 | 7/1980 |
| JP | 2009-216618 | 9/2009 |

* cited by examiner

*Primary Examiner* — John H Le
(74) *Attorney, Agent, or Firm* — Greenblum & Bernstein, P.L.C.

(57) ABSTRACT

A measuring apparatus is capable of separately measuring at least one of the purely resistive component and the reactance component of a measured circuit. The measuring apparatus applies an AC voltage to the measured circuit and detects a current flowing in the measured circuit. When doing so, a first detection signal whose amplitude changes in accordance with an amplitude of a real component of the current and a second detection signal whose amplitude changes in accordance with an amplitude of an imaginary component are generated. The at least one of a purely resistive component and a reactance component of the measured circuit is then calculated using the first detection signal and the second detection signal.

24 Claims, 11 Drawing Sheets

FIG. 7
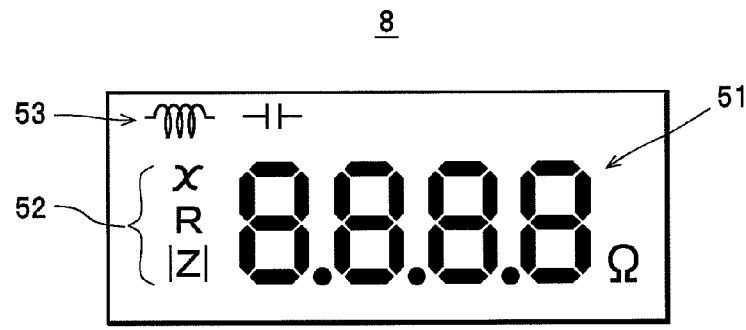
FIG. 8
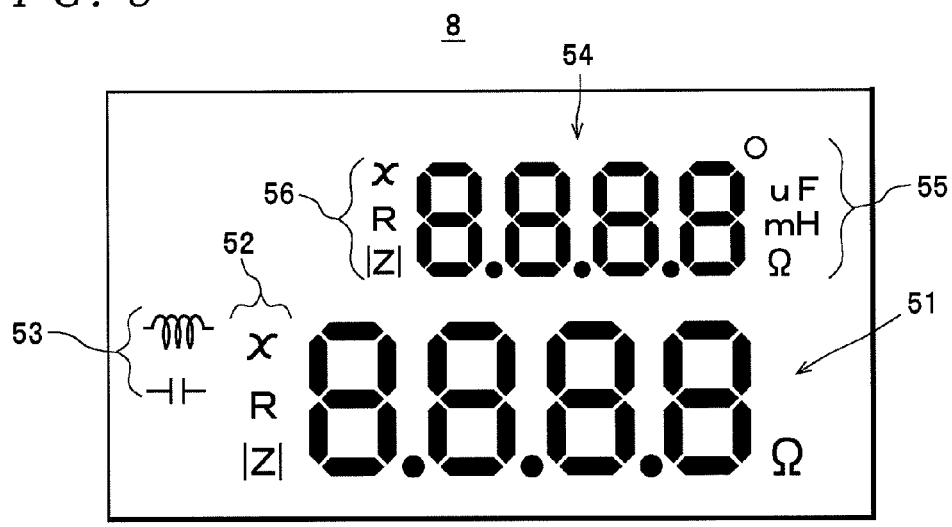
FIG. 9
| SUB-NUMERIC DISPLAY REGION 54 | θ | C | L | x | Z | θ | C | L | x | R | θ | C | L | R | Z |
|---|---|---|---|---|---|---|---|---|---|---|---|---|---|---|---|
| MAIN NUMERIC DISPLAY REGION 51 | R | R | R | R | R | Z | Z | Z | Z | Z | x | x | x | x | x |

FIG. 10
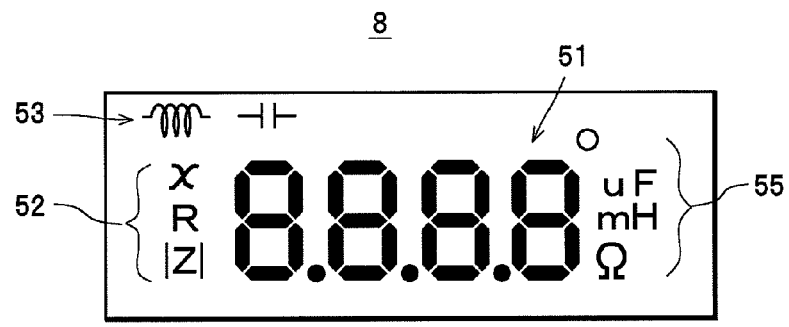
FIG. 11
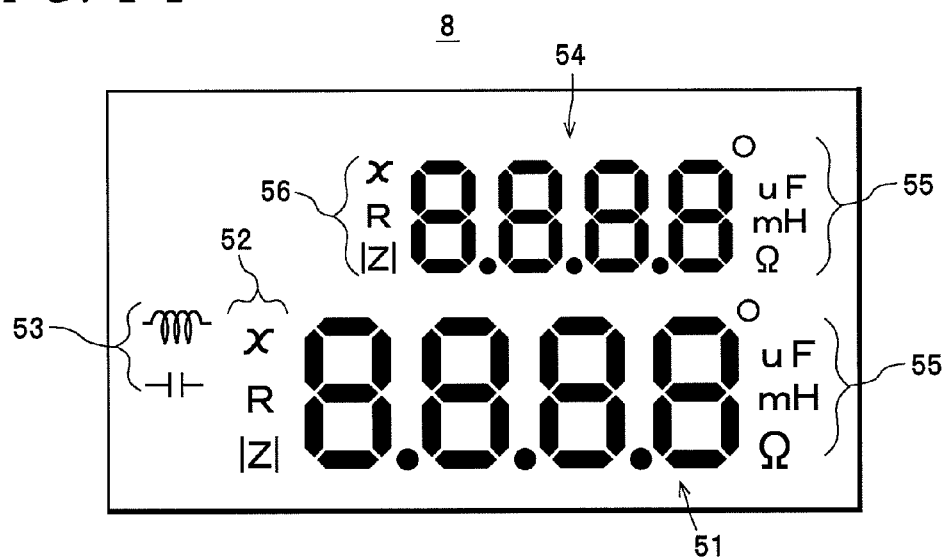
FIG. 12
| SUB-NUMERIC DISPLAY REGION 54 | θ | C | L | x | Z | θ | C | L | x | R | θ | C | L | R | Z |
|---|---|---|---|---|---|---|---|---|---|---|---|---|---|---|---|
| MAIN NUMERIC DISPLAY REGION 51 | L | L | L | L | L | L | C | C | C | C | C | C | θ | θ | θ | θ |

Dst

| No | DA1 | DA0 | CLK0 | CLK90 |
|----|-----|-----|------|-------|
| 1  | 0   | 1   | 0    | 0     |
| 2  | 0   | 1   | 0    | 0     |
| 3  | 1   | 0   | 0    | 0     |
| 4  | 1   | 0   | 1    | 0     |
| 5  | 1   | 1   | 1    | 0     |
| 6  | 1   | 1   | 1    | 0     |
| 7  | 1   | 1   | 1    | 1     |
| 8  | 1   | 1   | 1    | 1     |
| 9  | 1   | 0   | 1    | 1     |
| 10 | 1   | 0   | 0    | 1     |
| 11 | 0   | 1   | 0    | 1     |
| 12 | 0   | 1   | 0    | 1     |

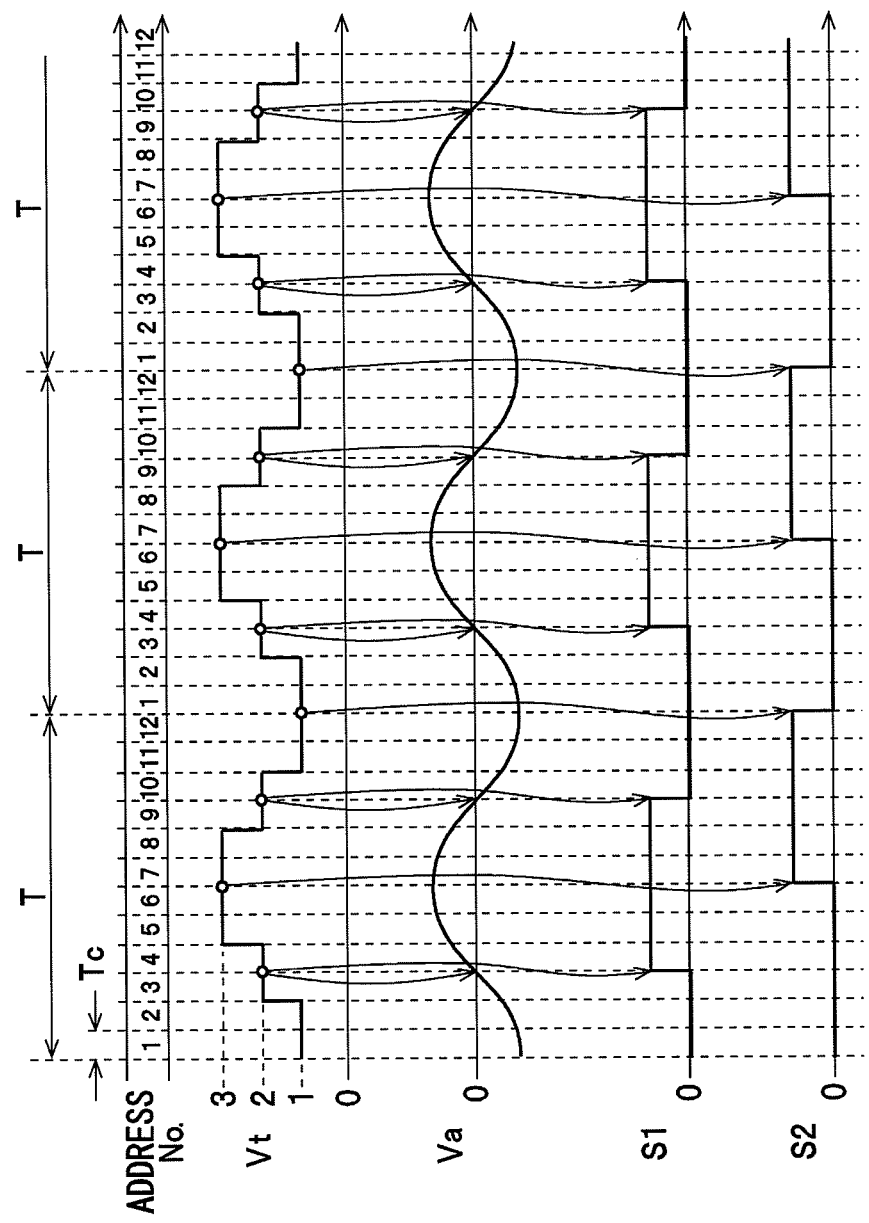
F I G. 1 5

MEASURING APPARATUS

BACKGROUND OF THE INVENTION

1. Field of the Invention

The present invention relates to a measuring apparatus that measures the impedance (at least one out of a purely resistive component and a reactance component) of a measured circuit.

2. Description of the Related Art

As one example of this type of measuring apparatus, a resistance measuring apparatus (hereinafter "first measuring apparatus") disclosed in Patent Document 1 indicated below is known. This resistance measuring apparatus includes an injection transformer that injects, into a measured network (measured circuit), a current with a second frequency that is capable of being discriminated from a current with a first frequency flowing in the measured network, a detection transformer (detection coil) that detects the above two types of current flowing in the measured network, a frequency selecting circuit that takes a second frequency component out of the output of the detection transformer, and a display means that displays the output of the frequency selecting circuit. In addition, the injection transformer includes an injection coil that is provided with an output voltage of an oscillator and injects the current with the second frequency into the measured network, and a feedback coil, and is equipped with a feedback loop that varies the voltage supplied to the injection coil so as to control the voltage induced in the feedback coil to become a constant value.

In this resistance measuring apparatus, since the injection voltage obtained by dividing the voltage induced in the feedback coil by the ratio of the number of turns in the return coil to the number of connected wires in the measured network (i.e., the number of wires to which the injection transformer is attached, in this example one wire) is also controlled to become a constant value, by detecting the voltage generated across a resistor connected to the detection transformer due to the current flowing in the detection transformer, it is possible to measure a value (i.e., measured resistance) for the resistive elements connected in the measured network based on the resistance value of the resistor connected to the detection transformer, the voltage generated in such resistor, the voltage generated in the feedback coil, and the number of turns in the injection coil and the number of turns in the detection transformer (detection coil).

As another example of a measuring apparatus, the present inventors have already proposed an impedance measuring apparatus (hereinafter "second measuring apparatus") disclosed in Patent Document 2 indicated below. This impedance measuring apparatus includes a voltage injecting unit that injects a test AC voltage into a measured circuit, a current measuring unit that measures the AC current flowing in the measured circuit due to injection of the test AC voltage, and a processing unit that calculates the impedance of the measured circuit based on the injected test AC voltage and the measured AC current. Here, the voltage injecting unit is constructed so as to be capable of injecting a plurality of different test AC voltages with different frequencies into the measured circuit and the processing unit calculates the impedance for each frequency of the test AC voltages.

As one example, assume an example configuration where test AC voltages of two frequencies are injected into the measured circuit. When a noise current (or simply "noise") of the same frequency as one of the two frequencies is flowing in the measured circuit, due to the noise current, there is a large drop in measurement precision for the resistance value measured when a test AC voltage of such frequency is applied. In this case, the resistance value calculated (measured) when the test AC voltage of such frequency is applied will definitely be calculated as a smaller value than the resistance value calculated (measured) when the test AC voltage of the other frequency (i.e., a frequency that differs to the frequency of the noise current) is applied. This is because the AC current measured by the current measuring unit increases by an amount corresponding to the noise current being superimposed, and as a result, the resistance value of the measured circuit is calculated as a smaller value than the actual value. Accordingly, by specifying that the resistance value with the larger of the two values is the resistance value of the measured circuit, it is possible to specify the resistance value of the frequency that is less affected by noise as the resistance value of the measured circuit.

Accordingly in this impedance measuring apparatus, even when a noise current is flowing in the measured circuit, by measuring the impedance calculated when a test AC voltage of the frequency that is less affected by the noise current was injected into the measured circuit as the final impedance of the measured circuit, it is possible to reduce the effect of the noise current. As a result, it is possible to sufficiently improve the measurement precision for impedance.

Patent Document 1
Japanese Laid-Open Patent Publication No. 555-90862 (see Pages 1 to 4 and FIG. 2)
Patent Document 2
Japanese Laid-Open Patent Publication No. 2009-216618 (see Pages 1 to 6 and FIG. 1)

SUMMARY OF THE INVENTION

However, in a measured network to which a measured resistance is connected, since inductance of the wires will definitely be present, the value of the measured resistance measured by the resistance measuring apparatus described above (the "first measuring apparatus") includes not only a purely resistive component of the measured resistance but also a reactance component due to the inductance mentioned above. This means that although it would be desirable to accurately measure the purely resistive component of the measured resistance, since the resistance value measured by the resistance measuring apparatus described above includes both the purely resistive component of the measured resistance and the reactance component mentioned above, there is the problem that it is not possible to measure only the purely resistive component as desired. Also, although there are also cases where it is necessary to separate and measure only the reactance component, with the resistance measuring apparatus described above, there is a further problem in that it is not possible to separate and measure the reactance component.

In the impedance measuring apparatus ("second measuring apparatus") described above, by measuring the current flowing in the measured circuit in a state where no test AC current is being injected into the measured circuit, it is possible to measure the noise current. For this reason, the present inventors have already developed an impedance measuring apparatus (hereinafter "third measuring apparatus") that has two measuring modes composed of a resistance measuring mode and a noise current measuring mode and is capable of manually switching to one of such measuring modes.

However, in the impedance measuring apparatus (third measuring apparatus) that has already been developed, it is necessary, both when it is desirable to know the noise current during the measuring of resistance and when it is desirable to know the resistance during the measuring of the noise current, to manually switch the measuring mode to the desired measuring mode, resulting in the problem that operation is complex.

The present invention was conceived to solve the problem with the first measuring apparatus described above and it is a first principal object of the present invention to provide a measuring apparatus that is capable of separately measuring at least one of the purely resistive component and the reactance component of a measured circuit.

The present invention was also conceived to solve the problem with the third measuring apparatus described above and it is a second principal object of the present invention to provide a measuring apparatus (impedance measuring apparatus) where it is possible to confirm both the impedance and the noise current without having to manually switch between a resistance measuring mode and a noise current measuring mode.

To achieve the first principal object described above, a measuring apparatus according to the present invention comprises: a voltage injecting unit that injects a test AC signal into a measured circuit by applying an AC voltage to an injection coil; a current detecting unit that uses a detection coil to detect an AC current flowing in the measured circuit due to injection of the test AC signal and outputs a detection signal whose amplitude changes in accordance with an amplitude of the AC current based on a current detection signal outputted from the detection coil; a processing unit that calculates a current value of the AC current based on the detection signal and calculates at least one of a purely resistive component and a reactance component of the measured circuit as measurement values based on the calculated current value of the AC current and a voltage value of the injected test AC signal; a first signal generating unit that generates and outputs a first signal that has a same period as a fundamental wave of the AC voltage and is synchronized with the fundamental wave of the AC voltage; and a second signal generating unit that generates and outputs a second signal whose phase is perpendicular to the first signal, wherein the current detecting unit carries out synchronous detection on the current detection signal using the first signal and outputs a first detection signal whose amplitude changes in accordance with an amplitude of a real component of the AC current as the detection signal and carries out synchronous detection on the current detection signal using the second signal and outputs a second detection signal whose amplitude changes in accordance with an amplitude of an imaginary component of the AC current as the detection signal, and the processing unit executes: a resistance value calculating process that calculates an absolute value of the current value of the AC current based on the first detection signal and the second detection signal and calculates an absolute value of an impedance of the measured circuit based on the calculated absolute value and the voltage value of the test AC signal; a phase angle calculating process that calculates a phase angle between the AC current and the test AC signal based on the first detection signal and the second detection signal; and a measurement value calculating process that calculates the measurement values based on the calculated absolute value of the impedance and the calculated phase angle.

To achieve the first principal object described above, another measuring apparatus according to the present invention comprises: a voltage injecting unit that injects a test AC signal into a measured circuit by applying an AC voltage to an injection coil; a current detecting unit that uses a detection coil to detect an AC current flowing in the measured circuit due to injection of the test AC signal and outputs a detection signal whose amplitude changes in accordance with an amplitude of the AC current based on a current detection signal outputted from the detection coil; a processing unit that calculates a current value of the AC current based on the detection signal and calculates at least one of a purely resistive component and a reactance component of the measured circuit as measurement values based on the calculated current value of the AC current and a voltage value of the injected test AC signal; a first signal generating unit that generates and outputs a first signal that has a same period as a fundamental wave of the AC voltage and is synchronized with the fundamental wave of the AC voltage; and a second signal generating unit that generates and outputs a second signal whose phase is perpendicular to the first signal, wherein the current detecting unit carries out synchronous detection on the current detection signal using the first signal and outputs a first detection signal whose amplitude changes in accordance with an amplitude of a real component of the AC current as the detection signal and carries out synchronous detection on the current detection signal using the second signal and outputs a second detection signal whose amplitude changes in accordance with an amplitude of an imaginary component of the AC current as the detection signal, and the processing unit executes: a resistance value calculating process that calculates an absolute value of the current value of the AC current based on the first detection signal and the second detection signal and calculates an absolute value of an impedance of the measured circuit based on the calculated absolute value and the voltage value of the test AC signal; a ratio calculating process that calculates a value of a ratio of one out of an amplitude of the real component and an amplitude of the imaginary component to another out of the amplitude of the real component and the amplitude of the imaginary component for the AC current based on the first detection signal and the second detection signal; and a measurement value calculating process that calculates the measurement values based on the calculated absolute value of the impedance and the calculated value of the ratio.

According to the measuring apparatuses described above, the current detecting unit carries out synchronous detection on the current detection signal outputted from the injection coil using the first signal that has the same period as and is synchronized with (i.e., has the same phase as) the fundamental wave of the AC voltage to output a first detection signal whose amplitude changes in accordance with the amplitude of the real component of the AC current flowing in the measured circuit and carries out synchronous detection on the current detection signal using the second signal whose phase is perpendicular to the first signal to output a second detection signal whose amplitude changes in accordance with the amplitude of the imaginary component of the AC current flowing in the measured circuit, with the processing unit executing a resistance value calculating process, a phase angle calculating process, or a ratio calculating process and a measurement value calculating process based on the first and second detection signals to separately calculate the purely resistive component and the reactance component of the measured circuit.

In the measuring apparatuses described above, the voltage injecting unit may include a primary signal generating unit that generates an AC primary signal and a phase shift unit that generates two AC signals, whose phases are respectively perpendicular, based on the AC primary signal, one AC signal out of the two AC signals may be applied to the injection coil as the AC voltage, the first signal generating unit may generate the first signal based on the one AC signal out of the two AC signals generated by the voltage injecting unit, and the second signal generating unit may generate the second signal based on another AC signal out of the two AC signals generated by the voltage injecting unit.

In such measuring apparatuses, the phase shift unit of the voltage injecting unit generates two AC signals with respectively perpendicular phases based on the AC primary signal outputted from the primary signal generating unit, the voltage injecting unit applies one AC signal out of the two AC signals as the AC voltage to the injection coil, the first signal generating unit generates the first signal based on the one AC signal described above out of the two AC signals generated by the phase shift unit, and the second signal generating unit generates the second signal based on the other AC signal out of the two AC signals generated by the phase shift unit.

Therefore, according to these measuring apparatuses, the phase shift unit is capable of generating two AC signals that are respectively perpendicular based on the AC primary signal outputted from the primary signal generating unit that is disposed inside the measuring apparatus and is not susceptible to external effects. This means that according to these measuring apparatuses, since it is possible to stably keep the phase difference between the first signal and the second signal generated based on both AC voltages at 90°, the first switching unit and the second switching unit are capable of outputting the first detection signal whose amplitude changes in accordance with the amplitude of the real component of the AC current flowing in the measured circuit and the second detection signal whose amplitude changes in accordance with the amplitude of the imaginary component of the AC current with high precision through synchronous detection. This means that the processing unit is capable of calculating the purely resistive component and the reactance component of the measured circuit with high precision based on the first and second detection signals that are highly precise.

Also, in the measuring apparatuses described above, the first signal generating unit may output the first signal in a state where the first signal is shaped into a rectangular wave, the second signal generating unit may output the second signal in a state where the second signal is shaped into a rectangular wave, the current detecting unit may include an inverting unit that inverts the current detection signal and outputs the inverted current detection signal as an inverted detection signal and first and second switching units that input the current detection signal and the inverted detection signal and selectively output one of the current detection signal and the inverted detection signal, the first switching unit may carry out synchronous detection on the current detection signal by switching between and outputting the current detection signal and the inverted detection signal based on the first signal, and the second switching unit may carry out synchronous detection on the current detection signal by switching between and outputting the current detection signal and the inverted detection signal based on the second signal.

According to the measuring apparatuses, by using a construction where the first signal generating unit and the second signal generating unit output the first signal and the second signal in the state where the first signal and the second signal are shaped into rectangular waves, in the current detecting unit, since it is possible to detect the first detection signal and the second detection signal by synchronous detection based on the current detection signal using the first switching unit and the second switching unit that selectively output one of the current detection signal and the inverted detection signal, it is possible for example to construct the first switching unit and the second switching unit using analog switches. As a result, it is possible to simplify the construction of the current detecting unit.

In the measuring apparatuses described above, the voltage injecting unit may include a memory, a CPU, a D/A converting circuit, and a power amplifier unit, a data table composed of digital data for an AC primary signal, digital data for the first signal whose phase matches the AC primary signal, digital data for the second signal whose phase is shifted by 90° with respect to the AC primary signal may be stored in advance in the memory; the CPU may repeatedly execute an operation that successively reads the digital data for the AC primary signal, for the first signal, and for the second signal from the data table with a period set in advance, output the digital data for the AC primary signal to the D/A converter circuit, and generate the first signal and the second signal by outputting the digital data for the first signal and for the second signal from corresponding output ports, the D/A converter circuit may convert the inputted digital data for the AC primary signal to a staircase wave and output the staircase wave as the AC primary signal, and the power amplifier unit may generate the AC voltage based on the AC primary signal and apply the AC voltage to the injection coil.

According to these measuring apparatuses, by using a construction where a digital circuit is used to generate the staircase wave, the first signal, and the second signal based on the digital data for the AC primary signal, the first signal, and the second signal, it is possible to stably and easily generate the first signal that has a phase difference of zero with (i.e., a matching phase for) the AC voltage generated from the staircase wave and the second signal whose phase is shifted by 90°.

Also, the measuring apparatuses described above may comprise a filter that is disposed on an output side of the D/A converter circuit, removes a harmonic component included in the staircase wave and outputs the filtered staircase wave as the AC primary signal to the power amplifier unit.

According to these measuring apparatuses, by providing a filter that removes the harmonic components included in the staircase wave and outputs the result to the power amplifier unit as the AC primary signal, it is possible to convert the staircase wave to a signal close to a sine wave and output such signal to the power amplifier unit as the AC primary signal. This means that it is possible to greatly reduce the high frequency noise generated from the measuring apparatuses.

Also, the measuring apparatuses described above may comprise an operation unit and a display unit, wherein in accordance with an operation content for the operation unit, the processing unit may select one value out of the purely resistive component, the reactance component, an absolute value of the impedance, an inductance and a capacitance of the measured circuit respectively calculated based on the reactance component and a frequency of the AC voltage, and a phase angle calculated based on the first detection signal and the second detection signal, and have the display unit display the selected value.

According to these measuring apparatuses, by operating the operation unit, it is possible for the user to select, display on the display unit and confirm a desired measurement value (parameter) out of the absolute value of the impedance, the purely resistive component, the reactance component, the inductance, the capacitance, and the phase angle.

Also, the measuring apparatuses described above may comprise an operation unit and a display unit including a main numeric display region and a sub numeric display region, wherein in accordance with an operation content for the operation unit, the processing unit may select two values out of the purely resistive component, the reactance component, an absolute value of the impedance, an inductance and a capacitance of the measured circuit respectively calculated based on the reactance component and a frequency of the AC voltage, and a phase angle calculated based on the first detection signal and the second detection signal, and display the selected two values in the main numeric display region and the sub numeric display region.

According to these measuring apparatuses, since it is possible to select two desired measurement values (parameters) out of the absolute value of the impedance, the purely resistive component, the reactance component, the inductance, the capacitance, and the phase angle and display the selected measurement values on the main numeric display region and the sub-numeric display region of the display unit, two measurement values can be simultaneously confirmed.

Also, the measuring apparatuses described above may comprise an operation unit and a display unit including a main numeric display region and a sub numeric display region, wherein in accordance with an operation content for the operation unit, the processing unit may select one value out of the purely resistive component, the reactance component, and an absolute value of the impedance and display the selected value in the main numeric display region, and select one out of a value out of the purely resistive component, the reactance component, and the absolute value of the impedance aside from the selected value being displayed in the main numeric display region, an inductance and a capacitance of the measured circuit respectively calculated based on the reactance component and a frequency of the AC voltage, and a phase angle calculated based on the first detection signal and the second detection signal, and display the selected value in the sub numeric display region.

According to these measuring apparatuses, it is possible to confirm one parameter selected out of the absolute value of the impedance, the purely resistive component, and the reactance component and to simultaneously confirm another parameter selected out of a different parameter out of the absolute value of the impedance, the purely resistive component, and the reactance component, an inductance of the measured circuit, a capacitance of the measured circuit, and a phase angle.

Also, in the measuring apparatuses described above, the processing unit may be operable when the calculated phase angle or the calculated value of the ratio is outside a standard range set in advance, to have the display unit display a symbol indicating that the calculated phase angle or the calculated value of the ratio is outside the standard range.

According to these measuring apparatuses, when the calculated phase angle is outside a standard range set in advance or the calculated value of the ratio is outside a standard range set in advance, a symbol indicating that the reactance component of the measuring circuit has become relatively large (has become predominant) is displayed on the display unit. This means that it is possible to inform the user that the error for the purely resistive component displayed on the display unit has become large, that is, that the accuracy has fallen.

To achieve the second principal object described above, a measuring apparatus according to the present invention comprises: a voltage injecting unit that injects a test AC voltage into a measured circuit; a current detecting unit that detects an AC current flowing in the measured circuit; a test current detecting unit that detects a test current flowing in the measured circuit due to injection of the test AC voltage from the AC current detected by the current detecting unit while the test AC voltage is being injected by the voltage injecting unit; a processing unit that executes an impedance calculating process calculating an impedance of the measured circuit based on the test AC voltage and the test current; and an output unit, wherein the processing unit alternately executes a noise current calculating process that calculates a noise current flowing in the measured circuit based on the AC current detected by the current detecting unit in a state where the injection of the test AC voltage by the voltage injecting unit is stopped and the impedance calculating process with a period set in advance to calculate the impedance and the noise current, and outputs the impedance and the noise current to the output unit.

In this measuring apparatus, by alternately executing a noise current calculating process that calculates a current value of a noise current flowing in the measured circuit based on the AC current flowing in the measured circuit detected by the current detecting unit in a state where the injection of the test AC voltage by the voltage injecting unit is stopped and the impedance calculating process with a period set in advance, the processing unit has the output unit alternately output the current value of the noise current and the impedance.

Therefore, according to this measuring apparatus, unlike an impedance measuring apparatus that has only the two measuring modes composed of the impedance measuring mode and the noise current measuring mode, the impedance calculating process and the noise current calculating process are automatically executed cyclically and the impedance and noise current are alternately outputted to the output unit. This means that it is possible to confirm the impedance and the noise current on the output unit without having to manually switch between the impedance measuring mode and the noise current measuring mode (i.e., without manually switching the measuring mode).

Also, the measuring apparatus described above may comprise a display unit as the output unit, wherein the impedance and the noise current outputted from the processing unit may be updated and displayed on a screen of the display unit.

According to this measuring apparatus, since the impedance and the noise current are updated and displayed on the screen of a display unit as the output unit, it is possible to easily and visually confirm the impedance and the noise current.

It should be noted that the disclosure of the present invention relates to the contents of Japanese Patent Application 2010-014284 that was filed on 26 Jan. 2010, Japanese Patent Application 2010-048532 that was filed on 5 Mar. 2010, Japanese Patent Application 2010-152670 that was filed on 5 Jul. 2010, Japanese Patent Application 2010-192075 that was filed on 30 Aug. 2010, and Japanese Patent Application 2010-257418 that was filed on 18 Nov. 2010, and the entire contents of which are herein incorporated by reference.

BRIEF DESCRIPTION OF THE DRAWINGS

These and other objects and features of the present invention will be explained in more detail below with reference to the attached drawings, wherein:

FIG. 7 is a diagram useful in explaining the construction of an example of an output unit as a display unit;

FIG. 8 is a diagram useful in explaining the construction of another example of an output unit as a display unit;

FIG. 9 is a diagram useful in showing combinations of parameters displayed in a numeric display region and a sub-numeric display region of the output unit in FIG. 8;

FIG. 10 is a diagram useful in explaining another construction of an output unit as a display unit;

FIG. 11 is a diagram useful in explaining yet another construction of an output unit as a display unit;

FIG. 12 is a diagram useful in showing additional combinations of parameters displayed in a numeric display region and a sub-numeric display region of the output unit in FIG. 11;

FIG. 15 is a waveform chart useful in explaining the operation of the integrated signal generating unit;

DESCRIPTION OF THE PREFERRED EMBODIMENTS

Preferred embodiments of a measuring apparatus according to the present invention will now be described with reference to the attached drawings.

First, the construction of a measuring apparatus 1 according to a first embodiment of the invention will be described with reference to the drawings.

Figure 1:
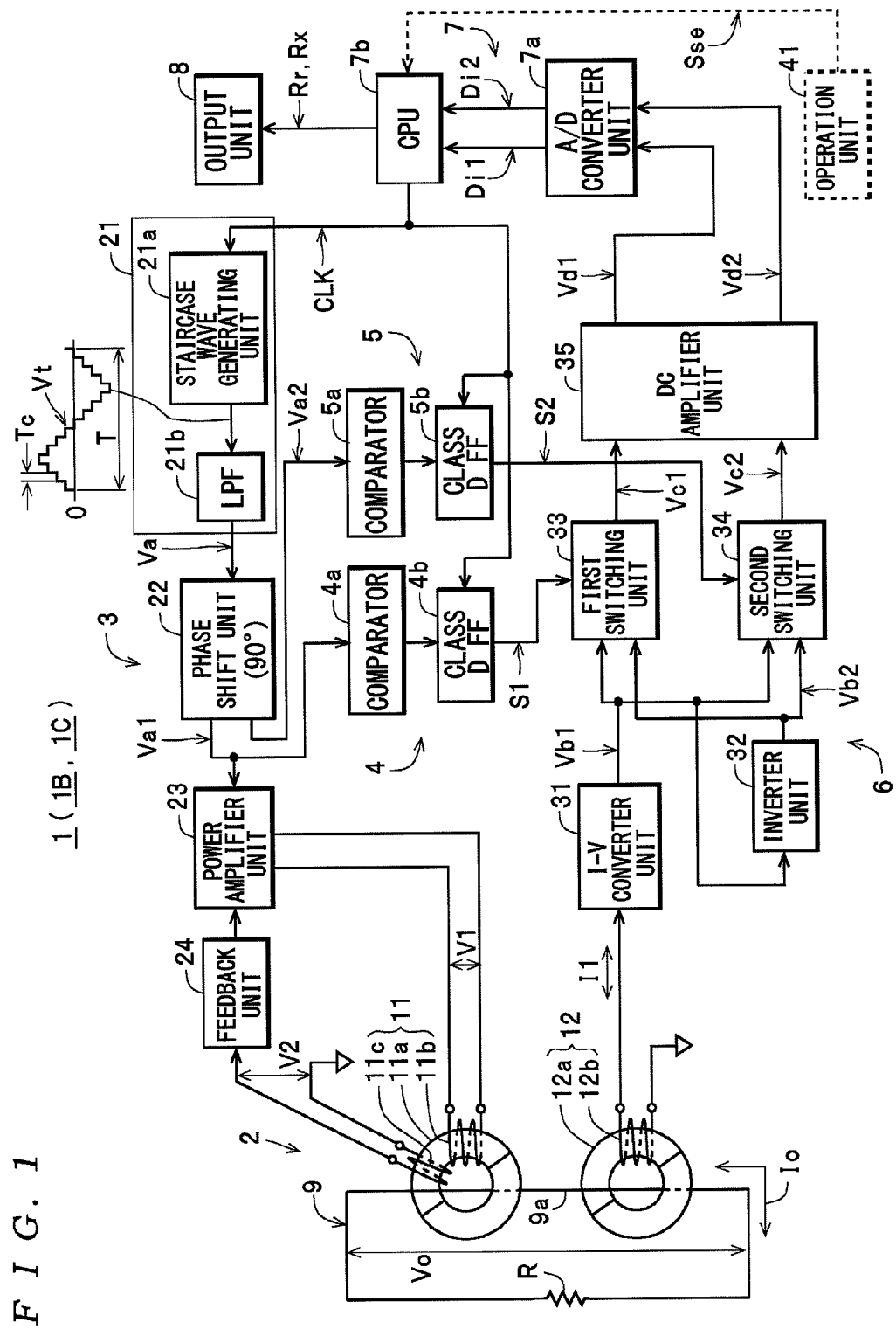
FIG. 1 is a configuration diagram showing the construction of a measuring apparatus.

The measuring apparatus 1 shown in FIG. 1 includes a clamp sensor 2, a voltage injecting unit 3, a first signal generating unit 4, a second signal generating unit 5, a current detecting unit 6, a processing unit 7, and an output unit 8, and is constructed so as to be capable of measuring a purely resistive component Rr and a reactance component Rx of a resistance (loop resistance) R of a measured circuit 9 as measurement values.

As one example, as shown in FIG. 1, the clamp sensor 2 includes an injection clamp 11 and a detection clamp 12 capable of being attached (clamped) to the measured circuit 9.

As shown in FIG. 1, the injection clamp 11 includes a ring-shaped core 11a constructed so as to be dividable, and an injection coil 11b (with a known number of turns: N1) and a feedback coil 11c that are wound around the core 11a. The injection clamp 11 is capable of being attached to the measured circuit 9 by dividing the core 11a. As shown in FIG. 1, the detection clamp 12 includes a ring-shaped core 12a constructed so as to be dividable, and a detection coil 12b (with a known number of turns: N2) that is wound around the core 12a. The detection clamp 12 is capable of being attached to the measured circuit 9 by dividing the core 12a. When the injection clamp 11 and the detection clamp 12 are attached (clamped) to a wire 9a that constructs part of the measured circuit 9, such wire 9a functions as a one-turn coil for the respective cores 11a, 12a.

As one example, the voltage injecting unit 3 includes a primary signal generating unit 21, a phase shift unit (90° phase shift) 22, a power amplifier unit 23, and a feedback unit 24. As one example, the primary signal generating unit 21 includes a staircase wave generating unit 21a and a filter 21b (as one example in this embodiment, a low-pass filter (hereinafter sometimes referred to as the "LPF 21b")), and generates and outputs an AC voltage (AC primary signal) Va. More specifically, the staircase wave generating unit 21a generates and outputs a triangular wave signal Vt with a predetermined period T (and frequency f). The triangular wave signal Vt is one example of a staircase wave and as shown in FIG. 1, is an analog signal whose amplitude changes in a staircase (i.e., in steps) with the period Tc of a reference clock CLK so that as a whole, the amplitude is in the form of a certain triangular waveform.

As one example, the staircase wave generating unit 21a includes a counter that is capable of selectively executing one of an upcounting operation and a downcounting operation in synchronization with the reference clock CLK, a flip-flop for repeatedly having the counter execute the upcounting operation and the downcounting operation, the D/A converter circuit that generates a staircase wave based on a count value outputted from the counter output terminals of the counter, and a capacitor that cuts out a DC component included in the staircase wave. None of such components are shown in the drawings. The LPF 21b inputs the triangular wave signal Vt and, by passing frequencies that are equal to or below a fundamental frequency component (the frequency f) of the triangular wave signal Vt and removing frequency components (harmonic components) that exceed the fundamental frequency component (the frequency f), converts the triangular wave signal Vt to an AC voltage (as one example in the present embodiment, a pseudo-sinewave voltage) Va which is outputted. Note that in place of the LPF described above, it is also possible to use a band pass filter (hereinafter simply "BPF") that inputs the triangular wave signal Vt and, by passing mainly the fundamental frequency component (the frequency f) of the triangular wave signal Vt and attenuating other frequency components (i.e., by selectively passing the fundamental frequency component), converts the triangular wave signal Vt to an AC voltage (pseudo-sinewave voltage) Va which is outputted.

As one example, the phase shift unit 22 includes two phase shift circuits (not shown) that input the AC voltage (pseudo-sinewave voltage) Va and shift the waveform by predetermined phase amounts and output the result. Here, the difference between the phase shifts of the respective phase shift circuits is set at 90°. By using this construction, the phase shift unit 22 generates and outputs two AC signals (as one example in the present embodiment, sinewave voltages) Va1, Va2 whose respective phases differ by 90° (i.e., whose phases are perpendicular). As one example in the present embodiment, assume that the phase of the sinewave voltage Va1 as a new AC primary signal is 90° in advance of the phase of the sinewave voltage Va2.

As one example in the present embodiment, the power amplifier unit 23 is constructed as a Class D amplifier and amplifies the sinewave voltage Va1 as an AC primary signal with a gain controlled by the feedback unit 24 to generate an AC voltage V1 (as one example in the present embodiment, a sinewave voltage (more specifically, pseudo-sinewave voltage)) with a voltage value set in advance (in the present embodiment, an effective voltage value) and applies the generated sinewave voltage V1 to the injection coil 11b of the injection clamp 11. Although not shown, as one example, the power amplifier unit 23 includes a signal generating circuit that generates a sawtooth signal of a certain frequency, a PWM signal generating circuit that compares the sawtooth signal with the sinewave voltage Va1 and generates a pulse signal (PWM signal) of a predetermined period whose pulse-width (duty ratio) changes in proportion to the amplitude of the sinewave voltage Va1, a Class D power amplifier circuit that amplifies the power of the PWM signal, and a low-pass filter circuit that generates the sinewave voltage V1 by carrying out a filtering process on the output signal from the Class D power amplifier circuit.

The feedback unit 24 detects a voltage V2 induced in the feedback coil 11c and controls the gain of the power amplifier unit 23 so that the voltage V2 becomes a voltage set in advance (the "certain voltage"). By using this construction, the power amplifier unit 23 becomes always capable of generating a sinewave voltage V1 of the certain voltage even if the input level of the sinewave voltage Va1 and/or the joined state of the ring-shaped core 11a somewhat changes.

By doing so, a test AC signal Vo with a predetermined frequency f and a predetermined effective voltage value is injected via the injection clamp 11 into the measured circuit 9. When doing so, since the wire 9a functions as described above as a one-turn coil for the core 11a, the test AC signal Vo injected into the measured circuit 9 has a voltage value (Vo=V1/N1) obtained by dividing the sinewave voltage V1 by the number of turns N1. Since the wire 9a also functions as a one-turn coil for the core 12a, the detection clamp 12 detects an AC current Io that flows in the measured circuit 9 and outputs a detection current (i.e., the current flowing in the detection coil) I1 (=Io/N2) to the detection coil 12b.

As shown in FIG. 1, as one example the first signal generating unit 4 includes a comparator 4a and a flip-flop (as one example in the present embodiment, a Class D flip-flop (also referred to as a "Class D FF") 4b, and generates and outputs a first signal S1 that has a same period as the fundamental wave of the sinewave voltage Va1 and is synchronized with the fundamental wave of the sinewave voltage Va1. First, in the first signal generating unit 4, by comparing the sinewave voltage Va1 and a reference voltage (zero volts), the comparator 4a outputs a rectangular wave signal whose polarity inverts at zero crosses in the sinewave voltage Va1 and whose duty ratio is 0.5 (as one example, a binary signal whose voltage is high when the sinewave voltage Va1 is positive and is zero volts when the sinewave voltage Va1 is negative). After this, by sampling the rectangular wave signal in synchronization with the reference clock CLK, the Class D FF 4b synchronizes rises and falls in the rectangular wave signal that fluctuate during a comparison operation by the comparator 4a to the reference clock CLK and removes noise components that are included in the rectangular wave signal but are not synchronized with the reference clock CLK (i.e., the Class D FF 4b shapes the signal into a rectangular wave) and outputs the result as the first signal S1.

As shown in FIG. 1, the second signal generating unit 5 includes a comparator 5a and the Class D FF 5b and has the same circuit construction as the first signal generating unit 4. In the second signal generating unit 5, in the same way as the comparator 4a, by comparing the sinewave voltage Va2 and a reference voltage (zero volts), the comparator 5a outputs a rectangular wave signal whose polarity inverts at zero crosses in the sinewave voltage Va2 and whose duty ratio is 0.5. By sampling the rectangular wave signal in synchronization with the reference clock CLK, the Class D FF 5b outputs the result as a second signal S2.

The current detecting unit 6 includes an I-V converter (a current-to-voltage converter) unit 31, an inverter unit 32, a first switching unit 33, a second switching unit 34, and a DC amplifier unit 35, and outputs a first detection signal ("detection signal") Vd1 whose amplitude changes in accordance with an amplitude of a real component of the AC current Io and a second detection signal ("detection signal") Vd2 whose amplitude changes in accordance with an amplitude of an imaginary component of the AC current Io. In this case, the I-V converter unit 31 is connected to one end of the detection coil 12b and converts the detection current I1 generated at the one end to a current detection signal Vb1 and outputs the current detection signal Vb1. The inverter unit 32 inputs the current detection signal Vb1 and inverts the polarity of the current detection signal Vb1 (in other words, shifts the phase by 180°), and outputs the result as an inverted detection signal Vb2.

Figure 2:
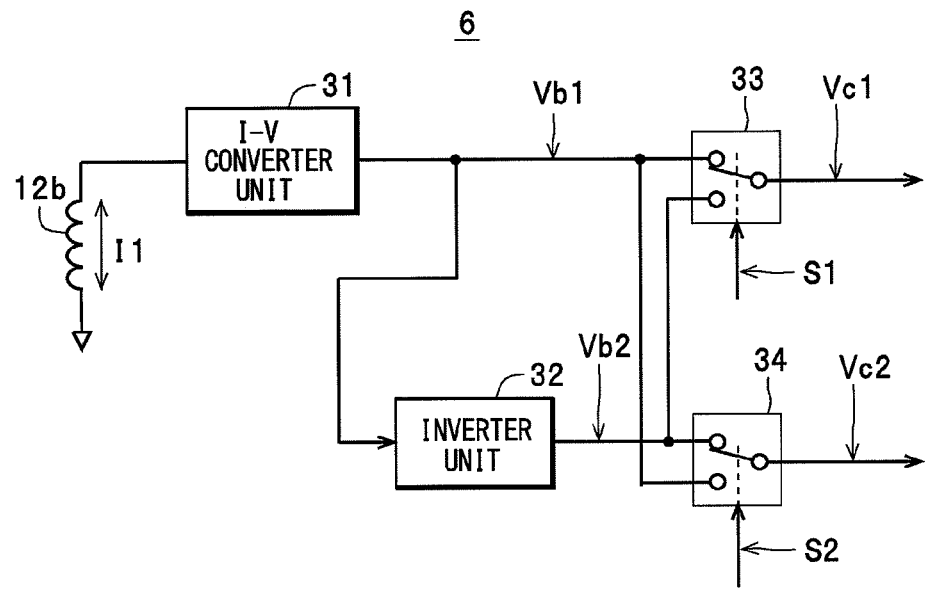
FIG. 2 is a circuit diagram that shows a current detecting unit of the measuring apparatus while omitting a DC amplifier unit.

As shown in FIGS. 1 and 2, the first switching unit 33 inputs the current detection signal Vb1 and the inverted detection signal Vb2 and selects and outputs (selectively outputs) one of the signals Vb1, Vb2 based on the level of the first signal S1. As one example, as shown in FIG. 2, the first switching unit 33 is constructed of a switch (an analog switch) that outputs the current detection signal Vb1 when the first signal S1 is at the high level and outputs the inverted detection signal Vb2 when the first signal S1 is at zero volts. By carrying out the operation described above, the first switching unit 33 equivalently carries out synchronous detection on the current detection signal Vb1 using the first signal S1 and outputs the result as a detection signal Vc1.

As shown in FIGS. 1 and 2, in the same way as the first switching unit 33, the second switching unit 34 inputs the current detection signal Vb1 and the inverted detection signal Vb2 and selects and outputs (selectively outputs) one of the signals Vb1, Vb2 based on the level of the second signal S2. As one example, in the same way as the first switching unit 33, as shown in FIG. 2, the second switching unit 34 is constructed of a switch (analog switch) that outputs the current detection signal Vb1 when the second signal S2 is at the high level and outputs the inverted detection signal Vb2 when the second signal S2 is at zero volts. By carrying out the operation described above, the second switching unit 34 equivalently carries out synchronous detection on the current detection signal Vb1 using the second signal S2 (i.e., a signal whose phase is perpendicular to the first signal S1) and outputs the result as a detection signal Vc2.

In this case, the detection signal Vc1, which is outputted as a result of synchronous detection by the first switching unit 33 based on the first signal S1 generated from the sinewave voltage Va1 that has the same phase as the sinewave voltage V1 applied to the injection coil 11b, is a signal whose amplitude changes in accordance with the amplitude of a current (that is, the real component of the AC current Io) regulated by the purely resistive component Rr of the resistance R of the measured circuit 9. On the other hand, the detection signal Vc2, which is outputted as a result of synchronous detection by the second switching unit 34 based on the second signal S2 generated from the sinewave voltage Va2 whose phase differs by 90° to (in the present embodiment, is 90° behind) the sinewave voltage V1 applied to the injection coil 11b, is a signal whose amplitude changes in accordance with the amplitude of a current (that is, the imaginary component of the AC current Io) regulated by the reactance component Rx of the resistance R of the measured circuit 9.

The DC amplifier unit 35 has two DC amplifier circuits, not shown, inputs the respective detection signals Vc1, Vc2, amplifies the signals Vc1, Vc2 with the same gain in the respective DC amplifier circuits, and outputs the amplified signals as the first and second detection signals Vd1, Vd2 to the processing unit 7.

The processing unit 7 includes an A/D converter unit 7a, a CPU 7b, and a memory (not shown). The A/D converter unit 7a has two A/D converter circuits, inputs the first and second detection signals Vd1 and Vd2, converts the signals Vd1 and Vd2 to digital data Di1, Di2 in the respective A/D converter circuits, and outputs the digital data Di1, Di2. Here, as described above, the detection signal Vc1 is a signal whose amplitude changes in accordance with the amplitude of the real component of the AC current Io. This means that the digital data Di1 for the first detection signal Vd1 generated by amplifying the detection signal Vc1 is data (hereinafter referred to as the "current data Di1") showing the amplitude (current value) of a real component of the AC current Io. Also, as described above, the detection signal Vc2 is a signal whose amplitude changes in accordance with the amplitude of the imaginary component of the AC current Io. This means that the digital data Di2 for the second detection signal Vd2 generated by amplifying the detection signal Vc2 is data (hereinafter referred to as the "current data Di2") showing the amplitude (current value) of an imaginary component of the AC current Io. The CPU 7b has a function that generates and outputs the reference clock CLK and executes a resistance value calculating process, a ratio calculating process, a phase angle calculating process, and a measurement value calculating process. As one example, the output unit 8 is constructed of a display unit such as a monitor apparatus and displays the result of the measurement value calculating process.

Next, a measurement operation for the measurement values (the purely resistive component Rr and the reactance component Rx) of the measured circuit 9 produced by the measuring apparatus 1 will be described.

In the measuring apparatus 1, first, the processing unit 7 starts to output the reference clock CLK. This reference clock CLK is outputted to the staircase wave generating unit 21a, and the respective Class D FFs 4b, 5b of the signal generating units 4, 5. By doing so, in the voltage injecting unit 3, the staircase wave generating unit 21a starts to generate and output the triangular wave signal Vt synchronized to the reference clock CLK and the LPF 21b converts the triangular wave signal Vt to the sinewave voltage (AC voltage) Va. Next, based on this AC voltage Va, the phase shift unit 22 starts to generate the sinewave voltages Va1, Va2 whose phases are respectively perpendicular (that is, the respective phases differ by) 90°. In the present embodiment, the phase of the sinewave voltage Va1 is 90° ahead of the phase of the sinewave voltage Va2.

The power amplifier unit 23 carries out a Class D amplification operation to amplify the inputted sinewave voltage Va1 to the sinewave voltage V1 and applies the sinewave voltage V1 to the injection coil 11b of the injection clamp 11. At this time, the feedback unit 24 detects the voltage V2 induced in the feedback coil 11c due to the sinewave voltage Va1 being applied to the injection coil 11b and controls the gain of the power amplifier unit 23 so that the voltage V2 becomes a voltage set in advance (a "certain voltage"). This means that the power amplifier unit 23 generates the sinewave voltage V1 with a certain voltage value and applies the sinewave voltage V1 to the injection coil 11b. By doing so, the test AC signal Vo (with the frequency f) is injected from the injection clamp 11 into the measured circuit 9 and due to the injection of the test AC signal Vo, the AC current Io with the frequency f flows in the measured circuit 9.

On the other hand, in the first signal generating unit 4, by comparing the sinewave voltage Va1 and the reference voltage, the comparator 4a starts to generate a rectangular wave signal whose polarity inverts at zero crosses in the sinewave voltage Va1 and the Class D FF 4b starts a process that synchronizes such rectangular wave signal to the reference clock CLK and outputs the result as the first signal S1. Similarly, in the second signal generating unit 5, by comparing the sinewave voltage Va2 and the reference voltage, the comparator 5a starts to generate a rectangular wave signal whose polarity inverts at zero crosses in the sinewave voltage Va2 and the Class D FF 5b starts a process that synchronizes such rectangular wave signal to the reference clock CLK and outputs the result as the second signal S2. By doing so, supplying of the first signal S1 and the second signal S2 as reference signals Sr from the signal generating units 4, 5 to the switching units 33, 34 of the current detecting unit 6 is commenced.

Figure 3:
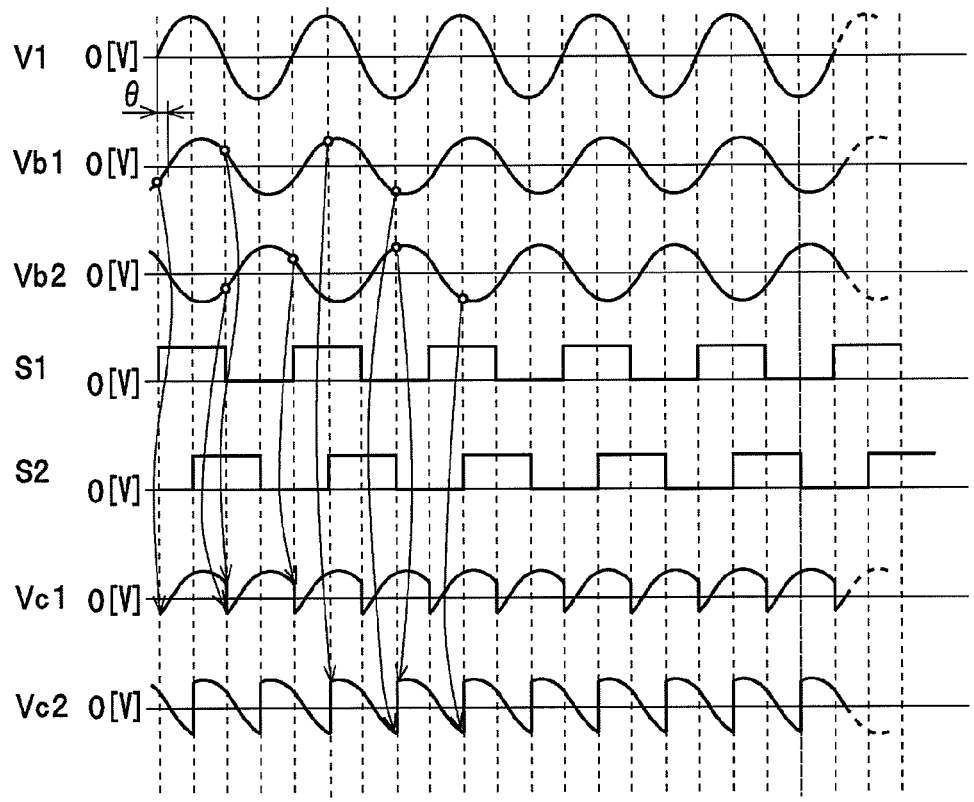
FIG. 3 is a waveform chart useful in explaining a synchronous detection operation by the current detecting unit.

In this case, since the sinewave voltage Va1 is amplified to the sinewave voltage V1 in the power amplifier unit 23, the sinewave voltage Va1 has the same phase as the sinewave voltage V1. Accordingly, in the first signal generating unit 4, as shown in FIG. 3, the first signal S1 generated from the sinewave voltage Va1 has a phase that matches the phase of the sinewave voltage V1. On the other hand, in the second signal generating unit 5, as shown in FIG. 3, the second signal S2 generated from the sinewave voltage Va2 whose phase is perpendicular to the sinewave voltage Va1 (in the present embodiment, the phase is 90° behind) has a phase that is 90° behind the first signal S1 (that is, 90° behind the sinewave voltage V1).

In a state where the test AC signal Vo with the frequency f is being injected into the measured circuit 9, the current detecting unit 6 executes a process that detects the AC current Io and generates the current data Di1, Di2. More specifically, in the current detecting unit 6, the detection clamp 12 detects the AC current Io flowing in the measured circuit 9 and outputs the detection current I1 from the detection coil 12b and the I-V converter unit 31 converts the detection current I1 to the current detection signal Vb1 which is then outputted. The inverter unit 32 inputs the current detection signal Vb1, inverts the polarity of the current detection signal Vb1 (i.e., shifts the phase by 180°) and outputs the resulting signal as the inverted detection signal Vb2. In this case, as described above, the resistance R of the measured circuit 9 includes the purely resistive component Rr and the reactance component Rx. This means that a phase difference δ is generated between the sinewave voltage V1 applied to the injection clamp 11 from the power amplifier unit 23 and the AC current Io flowing in the measured circuit 9 due to the sinewave voltage V1, and as a result, a phase difference θ is also produced as shown in FIG. 3 between the sinewave voltage V1 and the detection current I1 generated due to the AC current Io and also the current detection signal Vb1 generated from the detection current I1.

Next, by switching and outputting the current detection signal Vb1 and the inverted detection signal Vb2 in synchronization with the first signal S1 (i.e., by carrying out synchronous detection on the current detection signal Vb1 using the first signal S1), the first switching unit 33 outputs the detection signal Vc1, and by switching and outputting the current detection signal Vb1 and the inverted detection signal Vb2 in synchronization with the second signal S2 (i.e., by carrying out synchronous detection on the current detection signal Vb1 using the second signal S2), the second switching unit 34 outputs the detection signal Vc2 (see FIG. 3). The DC amplifier unit 35 inputs and amplifies the detection signals Vc1, Vc2 and outputs the results as the first and second detection signals Vd1, Vd2.

Next, the processing unit 7 (more specifically, the A/D converter unit 7a) inputs the first and second detection signals Vd1, Vd2 and converts such signals respectively to the current data Di1, Di2 that are then outputted. Here, as described above, the current data Di1 is data showing the amplitude (current value) of the real component of the AC current Io and the current data Di2 is data showing the amplitude (current value) of the imaginary component of the AC current Io.

Next, the processing unit 7 (more specifically, the CPU 7b) carries out a calculating process that calculates measurement values (the purely resistive component Rr and the reactance component Rx of the resistance R) of the measured circuit 9. More specifically, in the calculating process, the processing unit 7 first executes a resistance value calculating process that calculates an absolute value of the resistance R of the measured circuit 9 (i.e., the absolute value |Z| of the impedance Z of the measured circuit 9).

In the resistance value calculating process, the processing unit 7 first calculates a current value of the detection current I1 (i.e., the current value of the real component) based on the current data Di1 and calculates a current value of the AC current Io (the current value Ior of the real component (hereinafter simply the "real component Ior")) based on such calculated current value and the number of turns (N2) of the detection coil 12b. The processing unit 7 also calculates a current value of the detection current (i.e., the current value of the imaginary component) based on the current data Di2 and calculates the current value of the AC current Io (the current value Iox of the imaginary component (hereinafter simply the "imaginary component Iox")) based on such calculated current value and the number of turns (N2) of the detection coil 12b.

Next, the processing unit 7 calculates the absolute value of the AC current Io based on the calculated real component Ior and the imaginary component Iox. In this case, by adding the squares of the real component Ior and the imaginary component Iox and calculating the square root of the sum, the processing unit 7 calculates the absolute value (|Io|) of the AC current Io.

Next, by calculating an effective voltage value of a test AC signal Vx based on the effective voltage value (which, as described above, is known) of the AC voltage V1 and the number of turns (N1) in the injection coil 11b and finally dividing the effective voltage value of the calculated test AC signal Vx by the absolute value (|Io|) of the AC current Io described above, the processing unit 7 calculates the absolute value (|Z|) of the impedance of the measured circuit 9.

Next, the processing unit 7 executes the ratio calculating process. In the ratio calculating process, based on the real component Ior and the imaginary component Iox calculated in the resistance value calculating process described above, the processing unit 7 calculates a value A of the ratio of one of the real component Ior and the imaginary component Iox to the other. As one example in the present embodiment, the size (Iox/Ior) of the imaginary component Iox expressed in units of the real component Ior is calculated as the value A of the ratio. The processing unit 7 executes the phase angle calculating process to calculate the phase angle θ (=arctan(A)) based on the value A of the ratio. The phase angle θ is the phase angle (i.e., phase difference) between the test AC signal Vo injected into the measured circuit 9 and the AC current Io that flows in the measured circuit 9 due to the test AC signal Vo.

Lastly, the processing unit 7 executes the measurement value calculating process. Here, as described above, the following relationship $$Rr^2 + Rx^2 = |Z|^2 \quad (1)$$

is established for the calculated absolute value |Z| of the impedance and the purely resistive component Rr and the reactance component Rx of the resistance R of the measured circuit 9. Using the value A of the ratio described above, the following relationship $$Rx = Rr \times A \quad (2)$$

is also established between the purely resistive component Rr and the reactance component Rx. This means that based on the relationships (1) and (2), the purely resistive component Rr is calculated as the square root of $(|Z|^2/(1+A^2))$. Accordingly, in the measurement value calculating process, based on the calculated absolute value (|Z|) of the impedance of the measured circuit 9 and the value A of the ratio, the processing unit 7 calculates the purely resistive component Rr of the resistance R of the measured circuit 9 by calculating the square root of $(|Z|^2/(1+A^2))$, and by substituting the calculated purely resistive component Rr into the relationship (2) given above, calculates the reactance component Rx of the resistance R of the measured circuit 9. The processing unit 7 then has such values outputted (as one example in the present embodiment, displayed) as measurement values by the output unit 8. By doing so, the calculating process for measurement values of the measured circuit 9 (here, the purely resistive component Rr and the reactance component Rx of the resistance R) by the processing unit 7 is completed.

Note that when a construction is used that calculates the size (Ior/Iox) of the real component Ior expressed in units of the imaginary component Iox as the value A of the ratio is used, since the relationship (2) given above becomes Rr=Rx× A, in the measurement value calculating process, the processing unit 7 calculates the reactance component Rx of the resistance R of the measured circuit 9 by calculating the square root $(|Z|^2/(1+A^2))$ based on the absolute value (|Z|) of the impedance and the value A of the ratio and calculates the purely resistive component Rr of the resistance R of the measured circuit 9 by substituting the calculated reactance component Rx into such relationship (2) (Rr=Rx×A).

Also, in the measurement value calculating process, in place of the calculation method described above, it is possible to use a calculation method that uses the calculated phase angle θ and the absolute value (|Z|) of the impedance and calculates the purely resistive component Rr of the resistance R of the measured circuit 9 by multiplying the absolute value (|Z|) of the impedance by cos θ and calculates the reactance component Rx of the resistance R of the measured circuit 9 by multiplying the absolute value (|Z|) by sin θ.

In this way, according to the measuring apparatus 1, by carrying out synchronous detection on the current detection signal Vb1 outputted from the injection coil 11b of the injection clamp 11 using the first signal S1 that has the same phase as the sinewave voltage V1, the current detecting unit 6 outputs the first detection signal Vd1 whose amplitude changes in accordance with the amplitude of the real component Ior of the AC current Io, and by carrying out synchronous detection on the current detection signal Vb1 using the second signal S2 whose phase is perpendicular to the first signal S1, the current detecting unit 6 outputs the second detection signal Vd2 whose amplitude changes in accordance with the amplitude of the imaginary component Iox of the AC current Io. By carrying out at least one of the resistance value calculating process, the ratio calculating process, and the phase angle calculating process in addition to the measurement value calculating process based on these detection signals Vd1, Vd2, the processing unit 7 is capable of separating and calculating the purely resistive component Rr and the reactance component Rx of the measured circuit 9.

Also, in the measuring apparatus 1, the phase shift unit 22 of the voltage injecting unit 3 generates the sinewave voltage Va1 and the sinewave voltage Va2 whose respective phases are perpendicular based on the sinewave voltage Va outputted from the primary signal generating unit 21, the power amplifier unit 23 amplifies the sinewave voltage Va1 to the sinewave voltage V1 and applies the sinewave voltage V1 to the injection coil 11b, the first signal generating unit 4 generates the first signal S1 based on the sinewave voltage Va1 with the same phase as the sinewave voltage V1, and the second signal generating unit 5 generates the second signal S2 based on the sinewave voltage Va2.

Therefore, according to the measuring apparatus 1, the phase shift unit 22 is capable of generating both sinewave voltages Va1, Va2 based on the sinewave voltage Va outputted from the primary signal generating unit 21 that is disposed inside the measuring apparatus 1 and is not susceptible to external effects. This means that according to the measuring apparatus 1, since it is possible to stably keep the phase difference between the first signal S1 and the second signal S2 generated based on both sinewave voltages Va1, Va2 at 90°, the first switching unit 33 and the second switching unit 34 are capable of outputting the first detection signal Vd1 whose amplitude changes in accordance with the amplitude of the real component Ior of the AC current Io and the second detection signal Vd2 whose amplitude changes in accordance with the amplitude of the imaginary component Iox of the AC current Io with high precision through synchronous detection. This means that the processing unit 7 is capable of calculating the purely resistive component Rr and the reactance component Rx of the measured circuit 9 with high precision based on the detection signals Vd1, Vd2 that are highly precise.

According to the measuring apparatus 1, by using a construction where the first signal generating unit 4 and the second signal generating unit 5 output the first signal S1 and the second signal S2 in the state where the first signal S1 and the second signal S2 are shaped into rectangular waves, in the current detecting unit 6, since it is possible to detect the first detection signal Vd1 and the second detection signal Vd2 by synchronous detection based on the current detection signal Vb1 using the first switching unit 33 and the second switching unit 34 that selectively output one of the current detection signal Vb1 and the inverted detection signal Vb2, it is possible for example to construct the first switching unit 33 and the second switching unit 34 using analog switches. As a result, it is possible to simplify the construction of the current detecting unit 6.

Figure 4:
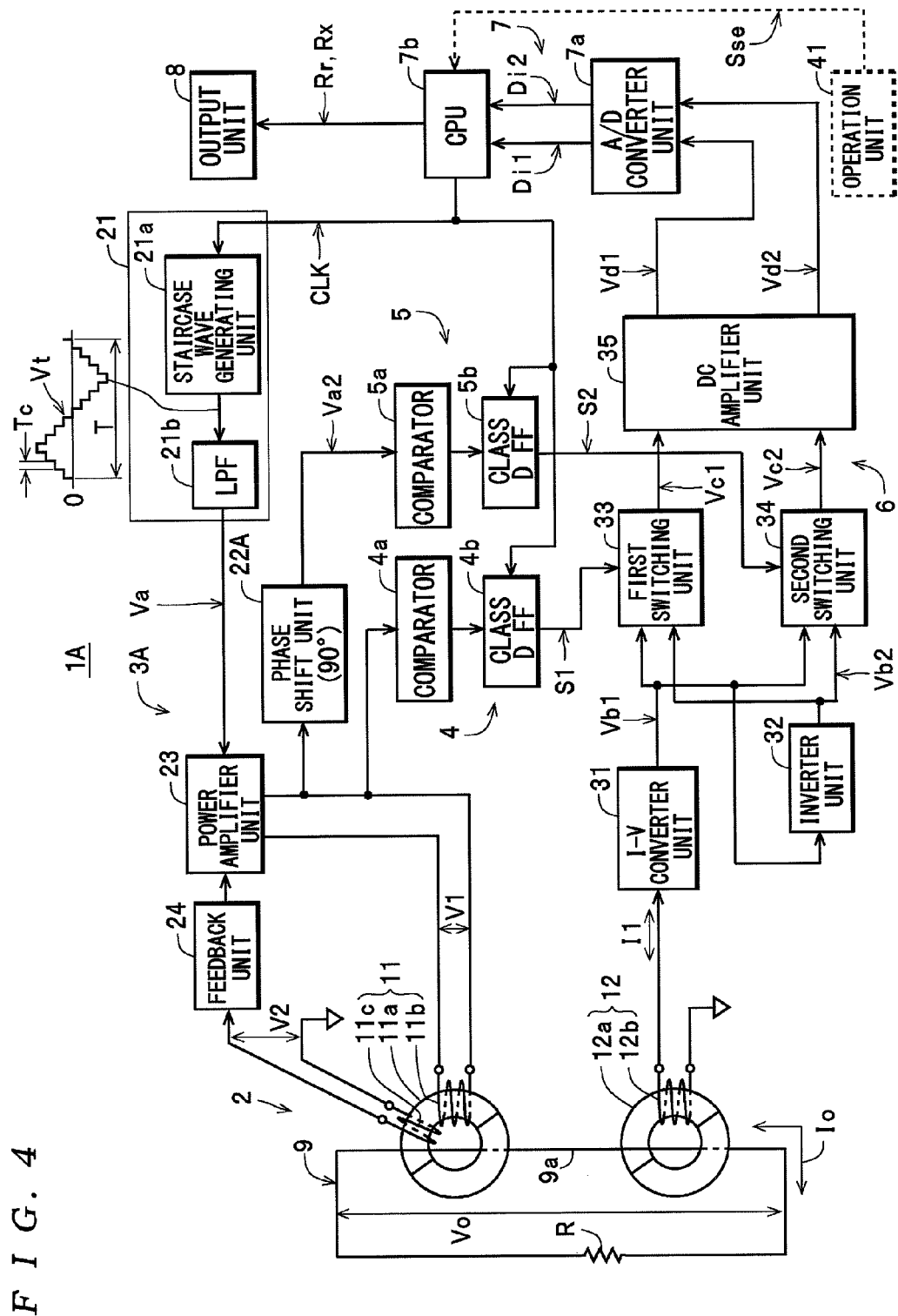
FIG. 4 is a configuration diagram showing the construction of another measuring apparatus.

Note that although a construction where the phase shift unit 22 generates two sinewave voltages Va1, Va2 with a phase difference between the voltages Va1, Va2 of 90° based on the sinewave voltage Va so that the phase difference between the first signal S1 and the second signal S2 is stably maintained at 90° has been described for the measuring apparatus 1 given above, like a measuring apparatus 1A shown in FIG. 4 (another example of a measuring apparatus according to the first embodiment of the present invention), it is also possible to use a construction equipped with a phase shift unit 22A that generates and outputs signals whose phase is 90° apart based on an inputted signal. Such measuring apparatus 1A will now be described. Note that since the measuring apparatus 1A differs to the measuring apparatus 1 only by including the phase shift unit 22A in place of the phase shift unit 22 and that the other component elements are the same as in the measuring apparatus 1, the same reference numerals have been assigned to component elements that are the same as in the measuring apparatus 1 and duplicated description thereof is omitted.

The measuring apparatus 1A includes the clamp sensor 2, a voltage injecting unit 3A, the first signal generating unit 4, the second signal generating unit 5, the current detecting unit 6, the processing unit 7, and the output unit 8. In this case, compared to the voltage injecting unit 3 of the measuring apparatus 1, the voltage injecting unit 3A differs by being constructed so that the sinewave voltage Va is directly outputted from the primary signal generating unit 21 to the power amplifier unit 23, by being equipped with the phase shift unit 22A in place of the phase shift unit 22, by being constructed so that the phase shift unit 22A inputs the sinewave voltage V1 applied from the power amplifier unit 23 to the injection coil 11b, generates a signal whose phase differs by 90° to the sinewave voltage V1, and outputs such signal to the second signal generating unit 5 as the sinewave voltage Va2, and by being constructed so that the first signal generating unit 4 generates the first signal S1 having inputted the sinewave voltage V1 in place of the sinewave voltage Va1.

In the same way as the measuring apparatus 1, in the measuring apparatus 1A, the current detecting unit 6 carries out synchronous detection on the current detection signal Vb1 outputted from the injection coil 11b of the injection clamp 11 using the first signal S1 that has the same phase as the sinewave voltage V1 and outputs the first detection signal Vd1 whose amplitude changes in accordance with the amplitude of the real component Ior of the AC current Io and carries out synchronous detection on the current detection signal Vb1 using the second signal S2 whose phase is perpendicular to the first signal S1 and outputs the second detection signal Vd2 whose amplitude changes in accordance with the amplitude of the imaginary component Iox of the AC current Io, with the processing unit 7 being capable, by executing at least one of the resistance value calculating process, the ratio calculating process, and the phase angle calculating process in addition to the measurement value calculating process based on the detection signals Vd1, Vd2, of separating and calculating the purely resistive component Rr and the reactance component Rx of the measured circuit 9.

In the measuring apparatuses 1, 1A described above, a construction is used where the current detecting unit 6 includes the inverter unit 32, and by having the first switching unit 33 and the second switching unit 34 switch between and output the current detection signal Vb1 and the inverted detection signal Vb2 outputted from the inverter unit 32 (a signal with inverted polarity (phase) compared to the current detection signal Vb1) based on the first signal S1 and the second signal S2 (that is, by having the first switching unit 33 and the second switching unit 34 carry out full-wave rectification), the levels of the detection signals Vc1, Vc2 that are the outputs of synchronous detection are increased, thereby achieving a favorable construction for increasing the precision of synchronous detection. However, like the current detecting unit 6A shown in FIG. 5, it is also possible to use a construction that is not equipped with the inverter unit 32 and inputs a reference potential (ground potential) into the first switching unit 33 and the second switching unit 34 in place of the inverted detection signal Vb2.

Figure 5:
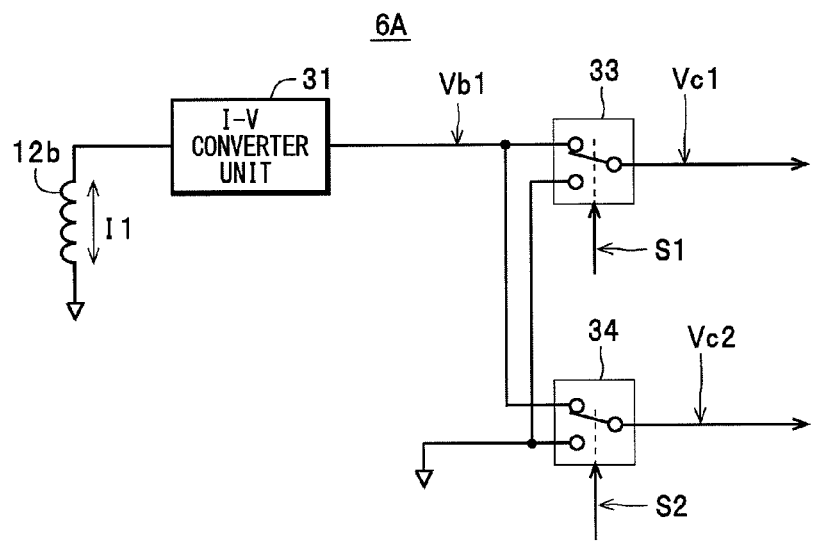
FIG. 5 is a circuit diagram that shows another current detecting unit while omitting a DC amplifier unit.
Figure 6:
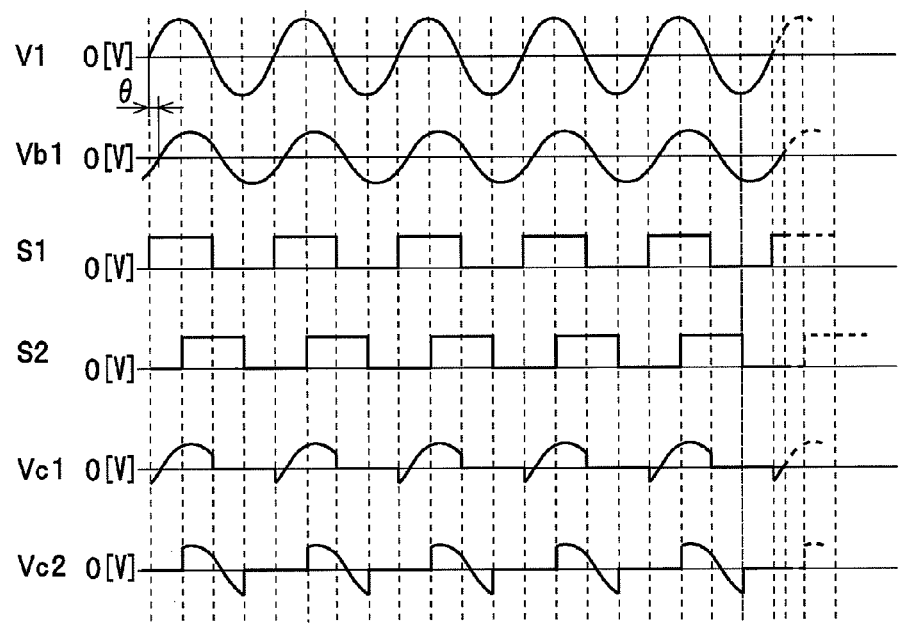
FIG. 6 is a waveform chart useful in explaining a synchronous detection operation by the current detecting unit.

In the current detecting unit 6A that uses the construction in FIG. 5, as shown in FIGS. 5 and 6, the first switching unit 33 generates the detection signal Vc1 by outputting a half-period part of the current detection signal Vb1 in one period of the first signal S1 (that is, by carrying out half-wave rectification), and in the same way the second switching unit 34 generates the detection signal Vc2 by outputting a half-period part of the current detection signal Vb1 in one period of the second signal S2 (that is, by carrying out half-wave rectification). Accordingly, compared to the current detecting unit 6 described above, although the levels of the detection signals Vc1, Vc2 drop to half, since the detection signal Vc1 is a signal whose amplitude changes in accordance with the amplitude of the real component Ior of the AC current Io and the detection signal Vc2 is a signal whose amplitude changes in accordance with the amplitude of the imaginary component Iox of the AC current Io, by executing at least one of the resistance value calculating process, the ratio calculating process, and the phase angle calculating process in addition to the measurement value calculating process based on the detection signals Vd1, Vd2 generated from the detection signals Vc1, Vc2, it is still possible for the processing unit 7 to separate and calculate the purely resistive component Rr and the reactance component Rx of the measured circuit 9.

Although a construction where the first signal generating unit 4 and the second signal generating unit 5 generate and output the first signal S1 and the second signal S2 that are rectangular waves has been described above in order to simply construct a synchronous detection circuit that generates the detection signals Vc1, Vc2 by synchronous detection using the first switching unit 33 and the second switching unit 34, it is also possible to generate the detection signals Vc1, Vc2 by carrying out synchronous detection using multipliers. In a construction that uses multipliers, it is possible to use a construction that directly outputs the analog signals that were inputted into the first signal generating unit 4 and the second signal generating unit 5 (as examples, the sinewave voltages Va1, Va2 in the measuring apparatus 1 that uses the phase shift unit 22 and the sinewave voltage V1 and the sinewave voltage Va2 in the measuring apparatus 1A that uses the phase shift unit 22A) into multipliers provided in place of the first switching unit 33 and the second switching unit 34 and omit the first signal generating unit 4 and the second signal generating unit 5. In addition, although a construction that measures both the purely resistive component Rr and the reactance component Rx of the measured circuit 9 has been described above, it is possible to apply the present invention to a construction that measures one of such components. In a construction that measures both the purely resistive component Rr and the reactance component Rx of the measured circuit 9, it is also possible to calculate the absolute value |Z| of the impedance of the measured circuit 9 based on the purely resistive component Rr and the reactance component Rx and output the absolute value |Z| to the output unit 8.

Also, as the construction that outputs the calculated absolute value |Z| of the impedance or the like (more specifically, a construction that displays the value), as the output unit 8, as examples, it is possible to use a construction (as a display unit) shown in FIG. 7 or in FIG. 8. Measuring apparatuses 1B, 1C that include the output unit 8 of such construction will now be described (other examples of a measuring apparatus according to the first embodiment).

Note that the components that are the same as in the measuring apparatuses 1, 1A described above have been assigned the same reference numerals and duplicated description thereof is omitted.

As shown by the broken line in FIG. 1, the measuring apparatus 1B with the output unit 8 of the construction shown in FIG. 7 includes an operation unit 41 in addition to the construction of the measuring apparatus 1. As examples, the operation unit 41 is constructed so as to include a touch panel, a keyboard, a mouse, or the like, generates a selection signal Sse for selecting a display content displayed on the output unit 8 in accordance with an operation content, and outputs the selection signal Sse to the processing unit 7 (more specifically, the CPU 7b). When the selection signal Sse is inputted, the processing unit 7 has a display content indicated by the selection signal Sse displayed on the output unit 8.

As one example, the output unit 8 constructed as a display unit uses an LCD (Liquid Crystal Display), and as shown in FIG. 7 includes a numeric display region 51, a first symbol display region 52, and a phase state display region 53. In this case, the numeric display region 51 is constructed so as to be capable of displaying a numeric value with a number of digits set in advance (in the illustrated example, four digits), a symbol (dot) for indicating a decimal point, and a unit symbol ("Ω"). In the numeric display region 51, one of the absolute value |Z| of the impedance, the purely resistive component Rr, and the reactance component Rx is selected and displayed. In the first symbol display region 52, as symbols showing the display content (i.e., the meaning of the displayed numeric value) displayed in the numeric display region 51, one of a symbol "|Z|" showing the absolute value |Z| of the impedance, the symbol "R" showing the purely resistive component Rr, and the symbol "x" showing the reactance component Rx is displayed. In the phase state display region 53, as a symbol showing the phase state (more specifically, the state of the phase angle) of the reactance component Rx with respect to the purely resistive component Rr, one of a coil symbol and a capacitor symbol is selected and displayed.

In the measuring apparatus 1B, when, as one example, the operation unit 41 generates a selection signal Sse indicating the selection of the absolute value |Z| of the impedance as the display content according to an operation of the operation unit 41 and outputs the selection signal Sse to the processing unit 7, the processing unit 7 that receives an input of such selection signal Sse has the calculated absolute value |Z| of the impedance displayed as the measurement value together with the unit symbol ("Ω") in the numeric display region 51 of the output unit 8. The processing unit 7 also has only the symbol "|Z|" corresponding to the absolute value |Z| of the impedance being displayed in the numeric display region 51 displayed in the first symbol display region 52.

When, as a different example, the operation unit 41 generates a selection signal Sse indicating the selection of the purely resistive component Rr as the display content according to an operation of the operation unit 41 and outputs the selection signal Sse to the processing unit 7, the processing unit 7 that receives an input of such selection signal Sse has the calculated purely resistive component Rr displayed as the measurement value together with the unit symbol ("Ω") in the numeric display region 51 of the output unit 8. The processing unit 7 also has only the symbol "R" corresponding to the purely resistive component Rr being displayed in the numeric display region 51 displayed in the first symbol display region 52.

When, as yet another example, the operation unit 41 generates a selection signal Sse indicating the selection of the reactance component Rx as the display content according to an operation of the operation unit 41 and outputs the selection signal Sse to the processing unit 7, the processing unit 7 that receives an input of such selection signal Sse has the calculated reactance component Rx displayed as the measurement value together with the unit symbol ("Ω") in the numeric display region 51 of the output unit 8. The processing unit 7 also has only the symbol "x" corresponding to the reactance component Rx being displayed in the numeric display region 51 displayed in the first symbol display region 52.

Also, if the purely resistive component Rr of the resistance R of the measured circuit 9 is small, since the reactance component Rx of the measured circuit 9 will be relatively large (i.e., become predominant), the measurement error for the purely resistive component Rr will become large. For this reason, in the measuring apparatus 1B, when the calculated phase angle θ is outside a range of angles set in advance, the processing unit 7 has one of the coil symbol and the capacitor symbol displayed in the phase state display region 53 to show that the reactance component Rx is predominant. In the present embodiment, as one example a range of no greater than +45° and no less than −45° is set as the range of angles for the phase angle θ, and when the phase angle θ exceeds +45° and is therefore outside the range of angles, the processing unit 7 has the coil symbol displayed in the phase state display region 53 to show that the reactance component Rx of the measured circuit 9 that is predominant is an inductive reactance component. On the other hand, when the phase angle θ is below −45° and is therefore outside the range of angles, the processing unit 7 has the capacitor symbol displayed in the phase state display region 53 to show that the reactance component Rx of the measured circuit 9 that is predominant is a capacitive reactance component.

Note that as described above the relationship "phase angle θ=arctan (A)" is established between the phase angle θ and the value A of the ratio. Accordingly, it is possible to use a construction where the determination described above as to whether the reactance component Rx is predominant is carried out using the value A of the ratio in place of the phase angle θ. In a measuring apparatus 1B constructed in this way, when the calculated value A of the ratio is outside a standard range set in advance, the processing unit 7 has one of the coil symbol and the capacitor symbol displayed in the phase state display region 53 to show that the reactance component Rx is predominant. Here, as one example, a range of no greater than +1 and no less than −1 (i.e., a range corresponding to the range described above of no greater than +45° and no less than −45° set for the phase angle θ) is set as the standard region for the value A of the ratio (=Rx/Rr), and when the value A of the ratio exceeds +1 and is therefore outside the standard range, the processing unit 7 has the coil symbol displayed in the phase state display region 53 to show that the reactance component Rx of the measured circuit 9 that is predominant is an inductive reactance component. On the other hand, when the value A of the ratio is below −1 and is therefore outside the standard range, the processing unit 7 has the capacitor symbol displayed in the phase state display region 53 to show that the reactance component Rx of the measured circuit 9 that is predominant is a capacitive reactance component.

In this way, according to the measuring apparatus 1B, by operating the operation unit 41, it is possible for the user to select a desired measurement value (parameter) out of the absolute value |Z| of the impedance, the purely resistive component Rr, and the reactance component Rx and have the selected value displayed on the output unit 8 where the value can be confirmed. In addition, according to the measuring apparatus 1B, since a symbol (the coil symbol or the capacitor symbol) is displayed on the output unit 8 to show that the reactance component Rx of the measured circuit 9 has become relatively large (i.e., has become predominant) when the calculated phase angle θ is outside the range of angles set in advance (or when the calculated value A of the ratio is outside the standard range set in advance), it is possible to notify the user that the error for the purely resistive component Rr displayed on the output unit 8 has increased, that is, that the accuracy has fallen. Note that as the method of determining whether the phase angle θ is outside a range of angles, it is possible to use a method that compares the absolute value of the phase angle θ with a range of angles. Here, for the example described above, the range of angles is set as no greater than 45° and no less than 0°. Similarly, as the method of determining whether the value A of the ratio is outside a standard range, it is possible to use a method that compares the absolute value of the value A of the ratio and a standard range. Here, for the example described above, the standard range is set as no greater than +1 and no less than 0.

Next, the measuring apparatus 1C (yet another example of a measuring apparatus according to the first embodiment) including the output unit 8 with the construction shown in FIG. 8 will be described. Note that the components that are the same as in the measuring apparatus 1B described above have been assigned the same reference numerals and duplicated description thereof is omitted.

As one example, the output unit 8 constructed as a display unit is constructed using an LCD (Liquid Crystal Display) and, as shown in FIG. 8, includes the numeric display region 51 as a main numeric display region, the first symbol display region 52, the phase state display region 53, a sub-numeric display region 54, a unit display region 55, and a second symbol display region 56. Here, the numeric display region 51 is constructed so that a display area thereof is larger than a display area of the sub-numeric display region 54 and is constructed so as to be capable of displaying larger numerals. In the same way as in the measuring apparatus 1B, one out of the absolute value |Z| of the impedance, the purely resistive component Rr, and the reactance component Rx is selected and displayed in the numeric display region 51, one of a symbol "|Z|" showing the absolute value |Z| of the impedance, the symbol "R" showing the purely resistive component Rr, and the symbol "x" showing the reactance component Rx is displayed in the first symbol display region 52, and one of a coil symbol and a capacitor symbol is selectively displayed in the phase state display region 53.

On the other hand, the sub-numeric display region 54 is capable of displaying a numeric value with a number of digits set in advance (in the illustrated example, four digits) and a symbol (dot) for indicating a decimal point. One out of the absolute value |Z| of the impedance, the purely resistive component Rr, the reactance component Rx, an inductance L, a capacitance C, and the phase angle θ is selected and displayed in the sub-numeric display region 54. One out of the symbol "Ω" showing the units of the absolute value |Z| of the impedance, the purely resistive component Rr, and the reactance component Rx, the symbol "mH" showing the units of the inductance L, the symbol "μF" showing the units of the capacitance C, and the symbol "°" showing the units of the phase angle θ is displayed in the unit display region 55. In the same way as the first symbol display region 52, one of a symbol "|Z|" showing the absolute value |Z| of the impedance, the symbol "R" showing the purely resistive component Rr, and the symbol "x" showing the reactance component Rx is displayed in the second symbol display region 56.

In the measuring apparatus 1C, according to an operation of the operation unit 41, the operation unit 41 generates the selection signal Sse that selects the display content of the numeric display region 51 and also selects the display content of the sub-numeric display region 54 and outputs the selection signal Sse to the processing unit 7. As one example in the present embodiment, according to an operation of the operation unit 41, the operation unit 41 generates and outputs a selection signal Sse that has an arbitrary combination (i.e., two parameters) out of the combinations shown in FIG. 9 displayed in the numeric display region 51 and the sub-numeric display region 54. Note that it is assumed in FIG. 9 that the symbol Z shows the absolute value |Z| of the impedance, the symbol R shows the purely resistive component Rr, the symbol x shows the reactance component Rx, the symbol L shows the inductance L, the symbol C shows the capacitance C, and the symbol θ shows the phase angle θ.

In the same way as in the measuring apparatus 1B described above, when the selection signal Sse has been inputted from the operation unit 41, the processing unit 7 has one of the absolute value |Z| of the impedance, the purely resistive component Rr, and the reactance component Rx displayed in the numeric display region 51 and has a symbol (one of the symbols |Z|, R, and x) corresponding to such display content displayed in the first symbol display region 52 in accordance with the display content of the numeric display region 51 indicated by the selection signal Sse. Also, in accordance with the relationship between the value of the phase angle θ and the range of angles set in advance (or in accordance with the relationship between the value A of the ratio and the standard range set in advance), the processing unit 7 judges whether it is necessary to display the coil or capacitor symbol in the phase state display region 53. When one of such symbols is to be displayed, the processing unit 7 decides the type of symbol and has such symbol displayed in the phase state display region 53.

In accordance with the display content of the sub-numeric display region 54 indicated by the selection signal Sse, the processing unit 7 also causes the sub-numeric display region 54 to switch to a display state where one out of the absolute value |Z| of the impedance, the purely resistive component Rr, the reactance component Rx, an inductance L, a capacitance C, and the phase angle θ is displayed or to a non-display state where no numeric value is displayed.

More specifically, when the display content of the sub-numeric display region 54 indicated by the selection signal Sse is the absolute value |Z| of the impedance, the processing unit 7 has the calculated absolute value |Z| of the impedance displayed in the sub-numeric display region 54. The processing unit 7 also has the symbol "|Z|" showing the absolute value |Z| of the impedance displayed in the second symbol display region 56 and has the symbol "Ω" showing the units of the absolute value |Z| of the impedance displayed in the unit display region 55.

Similarly, when the display content of the sub-numeric display region 54 indicated by the selection signal Sse is the purely resistive component Rr, the processing unit 7 has the calculated purely resistive component Rr displayed in the sub-numeric display region 54. The processing unit 7 also has the symbol "R" showing the purely resistive component Rr displayed in the second symbol display region 56 and has the symbol "Ω" showing the units of the purely resistive component Rr displayed in the unit display region 55. Meanwhile, when the display content of the sub-numeric display region 54 indicated by the selection signal Sse is the reactance component Rx, the processing unit 7 has the calculated reactance component Rx displayed in the sub-numeric display region 54. The processing unit 7 also has the symbol "x" showing the reactance component Rx displayed in the second symbol display region 56 and has the symbol "Ω" showing the units of the reactance component Rx displayed in the unit display region 55.

When the display content of the sub-numeric display region 54 indicated by the selection signal Sse is the inductance L or the capacitance C, based on the polarity of the calculated phase angle θ (or the polarity of the value A of the ratio), the processing unit 7 judges whether the component indicated by the reactance component Rx is an inductive reactance component or a capacitive reactance component and, when the indicated component is an inductive reactance component, calculates the inductance L based on the reactance component Rx and the frequency f of the sinewave voltage Va. On the other hand, when the indicated component is a capacitive reactance component, the processing unit 7 calculates the capacitance C based on the reactance component Rx and the frequency f of the sinewave voltage Va. After this, the processing unit 7 has the calculated inductance L or capacitance C displayed in the sub-numeric display region 54. The processing unit 7 also has a symbol (the symbol "mH" or the symbol "μF") showing the units corresponding to the display content of the sub-numeric display region 54 displayed in the unit display region 55. In this case, the processing unit 7 also causes the second symbol display region 56 to switch to a state where none of the symbols is displayed.

In this way, according to the measuring apparatus 1C, in addition to the effect of the measuring apparatus 1B in that it is possible to select a desired measurement value from the absolute value |Z| of the impedance, the purely resistive component Rr, and the reactance component Rx and display and confirm such value in the numeric display region 51 of the output unit 8, it is possible to have an arbitrary parameter that is not the parameter displayed in the numeric display region 51 (an arbitrary parameter that is a parameter aside from the parameter out of the purely resistive component Rr, the reactance component Rx and the absolute value |Z| of the impedance being displayed in the main numeric display region 51, the inductance L, the capacitance C, or the phase angle θ) displayed and confirmed in the sub-numeric display region 54. That is, according to the measuring apparatus 1C, it is possible to select a desired two parameters from the absolute value |Z| of the impedance, the purely resistive component Rr, and the reactance component Rx or to select a desired two parameters out of the absolute value |Z| of the impedance, the purely resistive component Rr, the reactance component Rx, the inductance L, the capacitance C, and the phase angle θ and to have the selected parameters simultaneously displayed and confirmed on the output unit 8.

Note that although a construction where parameters, such as the inductance L and the capacitance C, aside from the absolute value |Z| of the impedance, the purely resistive component Rr, and the reactance component Rx are calculated and selectively displayed in the sub-numeric display region 54 is used in the measuring apparatus 1C, for a construction that calculates only the absolute value |Z| of the impedance, the purely resistive component Rr, and the reactance component Rx, it is also possible to use a construction that includes the numeric display region 51 and the sub-numeric display region 54 and has a parameter aside from the parameter being displayed in the numeric display region 51 out of the absolute value |Z| of the impedance, the purely resistive component Rr, and the reactance component Rx selectively displayed in the sub-numeric display region 54. Also, although a construction where the numeric display region 51 and the sub-numeric display region 54 are disposed on a single LCD is used for the output unit 8 of the measuring apparatus 1C, the numeric display region 51 and the sub-numeric display region 54 may be constructed of separate LCDs or seven-segment displays.

Also, although constructions where the output unit 8 includes the phase state display region 53 and one of a coil symbol and a capacitor symbol is displayed in the phase state display region 53 are used in the measuring apparatuses 1B, 1C described above, it is also possible to apply the present invention to a construction that does not include the phase state display region 53.

In addition, although the measuring apparatuses 1B, 1C described above are based on the measuring apparatus 1 shown in FIG. 1, it should be obvious that the measuring apparatus 1A shown in FIG. 4 may be used as a base, the operation unit 41 described above may be disposed as shown by the broken line, and the processing unit 7 and the output unit 8 may be constructed in the same way as in the measuring apparatuses 1B, 1C.

Also, by disposing the unit display region 55 of the output unit 8 shown in FIG. 8 (that is, a display region for displaying one out of the symbol "Ω" showing the units of the absolute value |Z| of the impedance, the purely resistive component Rr, and the reactance component Rx, the symbol "mH" showing the units of the inductance L, the symbol "μF" showing the units of the capacitance C, and the symbol "°" showing the units of the phase angle θ) relative to the numeric display region 51 of the output unit 8 shown in FIG. 7 to produce the output unit 8 of the construction shown in FIG. 10, it is possible to realize a construction where one out of the absolute value |Z| of the impedance, the purely resistive component Rr, the reactance component Rx, the inductance L, the capacitance C, and the phase angle θ is displayed in the numeric display region 51 and a symbol showing the corresponding units is displayed in the unit display region 55.

Also, by disposing another unit display region 55 of the output unit 8 shown in FIG. 8 (that is, a display region for displaying one out of the symbol "Ω" showing the units of the absolute value |Z| of the impedance, the purely resistive component Rr, and the reactance component Rx, the symbol "mH" showing the units of the inductance L, the symbol "μF" showing the units of the capacitance C, and the symbol "°" showing the units of the phase angle θ) relative to the numeric display region 51 shown in FIG. 8 to produce the output unit 8 of the construction shown in FIG. 11, it is possible to use a construction where an arbitrary combination (i.e., two parameters) out of the combinations produced by adding the combinations shown in FIG. 12 to the combinations shown in FIG. 9 is displayed in the numeric display region 51 and the sub-numeric display region 54 and symbols showing the corresponding units are respectively displayed in the unit display regions 55.

As the construction for generating the first signal S1 that has the same period as the fundamental wave of the sinewave voltage Va1 and is synchronized to the fundamental wave of the sinewave voltage Va1 and the second signal S2 whose phase is shifted by 90° with respect to the first signal S1, a construction including the first signal generating unit 4, the second signal generating unit 5, and the phase shift unit 22 (22A) is used in the measuring apparatuses 1, 1A, 1B, and 1C described above, such that the two sinewave voltages Va1, Va2 (the sinewave voltages V1, Va2) whose respective phases are shifted by 90° are generated, with the first signal generating unit 4 generating the first signal S1 in synchronization with the reference clock CLK based on the sinewave voltage Va1 (the sinewave voltage V1), and the second signal generating unit 5 generating the second signal S2 in synchronization with the reference clock CLK based on the sinewave voltage Va2. However, by using a digital circuit that uses a CPU, an FPGA (Field Programmable Gate Array), or a CPLD (Complex Programmable Logic Device), it is possible to integrate components (aside from a filter that converts the triangular wave signal Vt to the AC voltage (pseudo-sinewave voltage) Va that is outputted) of the primary signal generating unit 21, the first signal generating unit 4, the second signal generating unit 5, and the phase shift unit 22 (22A) into a single digital circuit to produce an integrated signal generating unit that generates the AC voltage Va, the first signal S1, and the second signal S2.

Figures 13, 14:
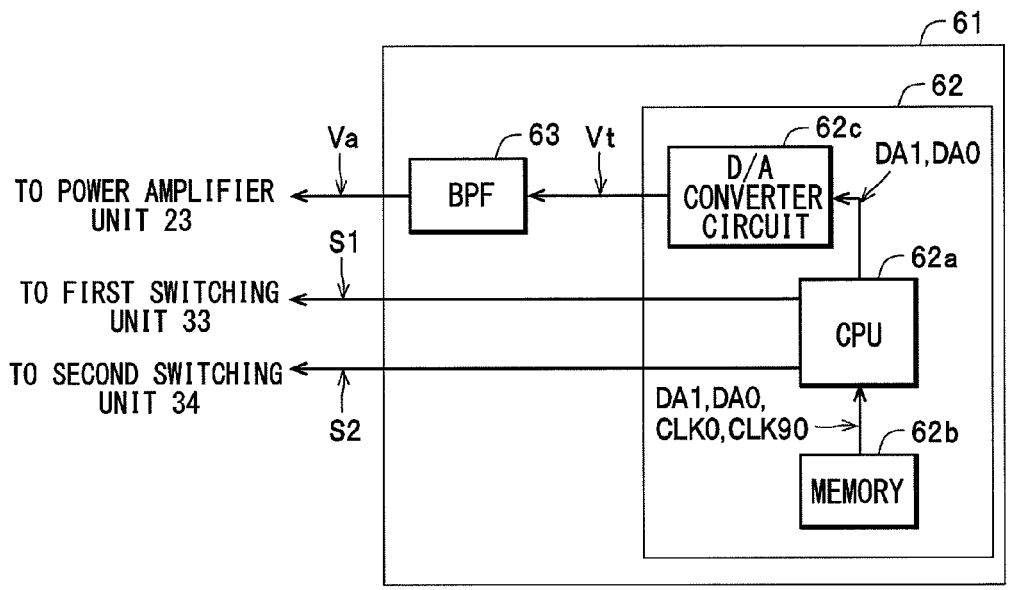
FIG. 13 is a block diagram useful in explaining the construction of an integrated signal generating unit.
FIG. 14 is a diagram useful in explaining the content of a data table stored in a memory in FIG. 13.

As one example, an integrated signal generating unit 61 constructed using a digital circuit including a CPU will now be described with reference to FIGS. 13 to 15.

First, the construction of the integrated signal generating unit 61 will be described. As shown in FIG. 13, the integrated signal generating unit 61 includes a signal generating circuit 62 and a filter 63 (as one example in the present embodiment, a band-pass filter 63 (hereinafter also referred to as the "BPF 63"). The signal generating circuit 62 is equipped with a CPU 62a, a memory 62b, and a D/A converter circuit 62c. Here, an operation program of the CPU 62a and a data table Dst used for signal generation shown in FIG. 14 are stored in advance in the memory 62b. In the data table Dst, digital data (as one example in the present embodiment, two-bit digital data) DA1, DA0 for generating the triangular wave signal Vt, digital data CLK0 for generating the first signal S1, and digital data CLK90 for generating the second signal S2 are given as a combination of one-bit values, with twelve combinations being stored in addresses from address 1 to address 12.

Next, the operation of the integrated signal generating unit 61 will be described. In the integrated signal generating unit 61, the CPU 62a operates in accordance with the operation program and executes a read operation, which reads the digital data DA1, DA0, CLK0, CLK90 stored in address 1 to address 12 from the data table Dst stored in the memory 62b in order of the address 1, 2, 3, ..., 11, 12 in successive periods Tc, repeatedly with a period T as shown in FIG. 15. Out of the digital data DA1, DA0 out of the digital data at the read addresses, the CPU 62a outputs the digital data DA1 as a most significant bit and the digital data DA0 as a least significant bit to the D/A converter circuit 62c. The CPU 62a outputs the digital data CLK0 to one of its own output ports, and outputs the digital data CLK90 to another of its own output ports. The D/A converter circuit 62c successively converts the digital data DA1, DA0 outputted from the CPU 62a to the triangular wave signal Vt as a staircase wave and outputs the triangular wave signal Vt. The BPF 63 inputs the triangular wave signal Vt and passes mainly the fundamental frequency component (frequency f) of the triangular wave signal Vt and attenuates other frequency components (including harmonic components) (i.e., selectively passes the fundamental frequency component) to convert the triangular wave signal Vt to the AC voltage (pseudo-sinewave voltage) Va which is outputted. Also, in place of a BPF, it is possible to use an LPF that passes frequencies equal to or below the fundamental frequency component (with the frequency f) of the triangular wave signal Vt and removes frequency components (harmonic components) that exceed the fundamental frequency component (with the frequency f) as the filter 63.

Note that in the measuring apparatuses 1, 1A, 1B, and 1C described above, by using the filter 21b (63) to remove the harmonic component included in the triangular wave signal (a triangular wave signal whose amplitude changes in steps) Vt as a staircase wave, a construction that generates an AC primary signal Va1 (Va) that is close to a sine wave and outputs the AC primary signal Va1 (Va) to the power amplifier unit 23 (that is, a construction that reduces the high frequency noise included in the sinewave voltage V1 outputted from the power amplifier unit 23 and thereby reduces the high frequency noise generated from the apparatus as a whole) is used. However, in a case where a sinewave signal as a staircase wave (a pseudo-sinewave whose amplitude changes in a staircase) is outputted from the beginning from the staircase wave generating unit 21a or the D/A converter circuit 62c, it is also possible to use a construction where such sinewave signal as a staircase wave is outputted to the power amplifier unit 23 as the AC primary signal Va1 (Va) without passing the filter 21b (63). By using such construction, it is possible to omit the filter 21b (63) and thereby simplify the apparatus construction.

By doing so, as shown in FIG. 15, the D/A converter circuit 62c generates and outputs an analog signal whose value changes with a period Tc in accordance with the digital data DA1, DA0 as the triangular wave signal Vt and the CPU 62a outputs the first signal S1 and the second signal S2 from the respective output ports as shown in FIG. 15. In this case, the digital data CLK0 stored in the data table Dst changes from "0" to "1" and back from "1" to "0" in synchronization with the timing at which the numeric value shown by the digital data DA1, DA0 changes from a first "2" to a next "2" within a period where two values of "2" are consecutive. This means that the first signal S1 generated based on the digital data CLK0 is a signal whose amplitude changes in synchronization with zero cross points of the AC voltage Va outputted from the BPF 63, that is, a signal whose phase matches the AC voltage Va. That is, together with the D/A converter circuit 62c and the BPF 63, the CPU 62a functions as the primary signal generating unit and the CPU 62a also functions as the first signal generating unit.

On the other hand, the digital data CLK90 stored in the data table Dst changes from "0" to "1" in synchronization with the timing at which the numeric value shown by the digital data DA1, DA0 changes from a second "3" to a third "3" within a period where four values of "3" are consecutive and changes from "1" to "0" in synchronization with the timing at which the numeric value shown by the digital data DA1, DA0 changes from a second "1" to a third "1" in a period where four values of "1" are consecutive. This means that the second signal S2 generated based on the digital data CLK90 is a signal whose phase is shifted by 90° with respect to the AC voltage Va outputted from the BPF 63. That is, the CPU 62a also functions as the second signal generating unit.

By using a construction that generates the triangular wave signal Vt, the first signal S1, and the second signal S2 based on the digital data DA1, DA0, CLK0, CLK90 using a digital circuit such as the integrated signal generating unit 61, it is possible to stably and easily generate the first signal S1, which has zero phase difference (i.e., a matching phase) to the triangular wave signal Vt and the AC voltage Va generated from the triangular wave signal Vt, and the second signal S2 whose phase has been shifted by 90°. Also, since it is possible to omit the phase shift unit 22 (22A), it is possible to omit a phase adjusting operation for the phase shift unit 22 (22A), which means that some processing steps can be omitted.

Note that although a construction that generates the triangular wave signal Vt from the two-bit digital data DA1, DA0 has been described above as one example, it should be obvious that it is possible to use a construction with an increased number of bits so as to generate the triangular wave signal Vt as a signal whose waveform is closer to a sinewave. It is also possible to use a construction where the CPU 7b that constructs the processing unit 7 also serves as the CPU 62a and the memory that constructs the processing unit 7 also serves as the memory 62b.

Next, the construction of a resistance measuring apparatus 101 that is one example of a measuring apparatus (impedance measuring apparatus) according to a second embodiment of the present invention will be described with reference to the drawings.

Figure 16:
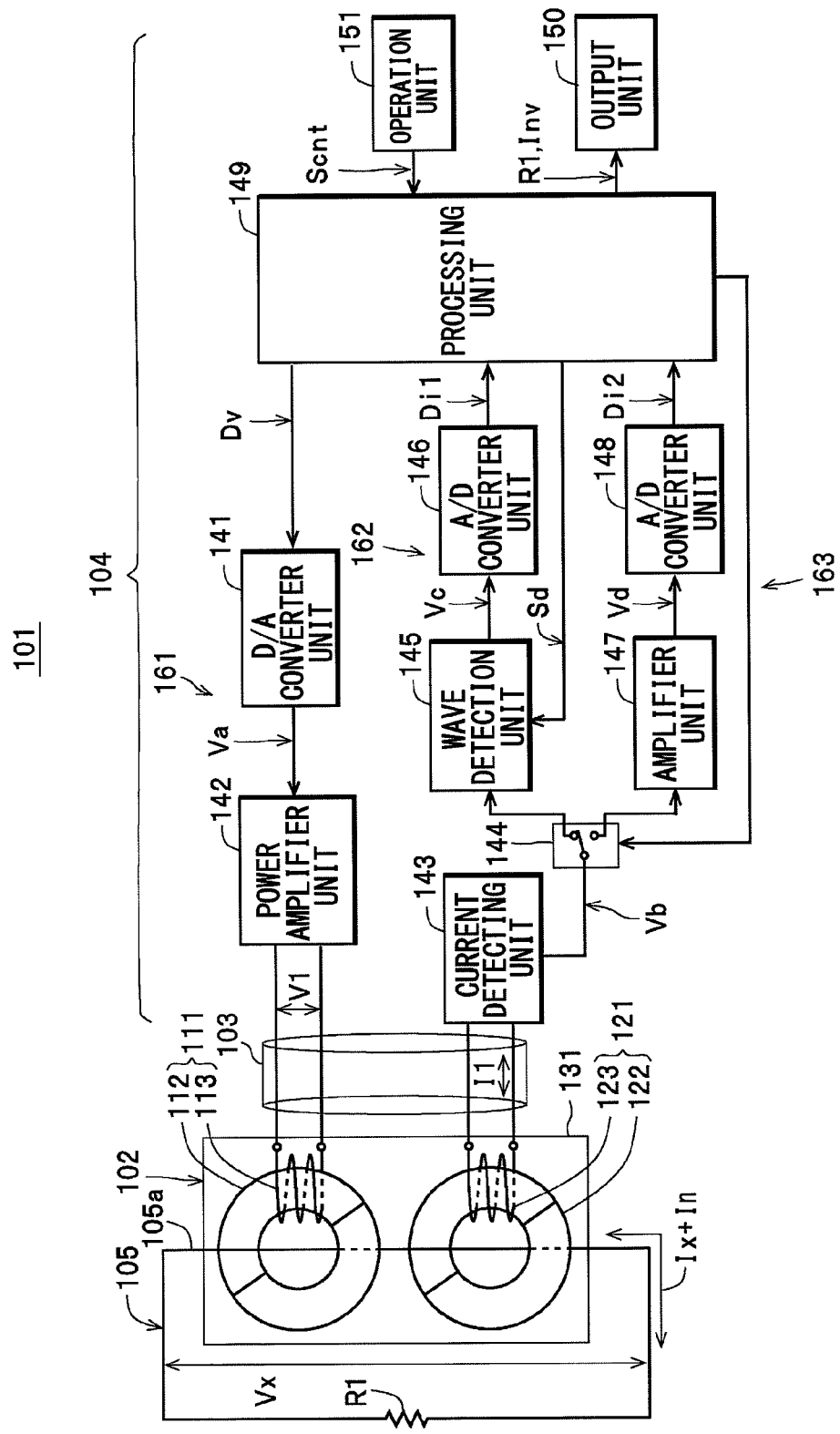
FIG. 16 is a configuration diagram showing the construction of a resistance measuring apparatus.

The resistance measuring apparatus 101 shown in FIG. 16 includes a clamp unit 102 and an appliance main unit 104 that is connected to the clamp unit 102 via a cable 103, and is constructed so as to be capable of measuring the impedance (as one example in the present embodiment, a resistance value R1 of a resistance (loop resistance) of a measured circuit 105.

As shown in FIG. 16, the clamp unit 102 includes an injection clamp unit 111, a detection clamp unit 121, and a housing 131. As one example, in the present embodiment, the injection clamp unit 111 includes a first ring-shaped core 112 divided into two, and a first coil 113 (with a known number of turns: N1) wound around the first ring-shaped core 112. The detection clamp unit 121 includes a second ring-shaped core 122 divided into two, and a second coil 123 (with a known number of turns: N2) wound around the second ring-shaped core 122. The injection clamp unit 111 and the detection clamp unit 121 are both enclosed in the housing 131 that is made of resin and in the shape of a clamp with a front end that is capable of being opened and closed, and are constructed so that the first ring-shaped core 112 and the second ring-shaped core 122 are simultaneously opened and closed by an operation that opens and closes the housing 131.

With the above construction, by opening the housing 131 and inserting a wire 105a that constructs part of the measured circuit 105 into the housing 131, the wire 105a is inserted inside the first ring-shaped core 112 and the second ring-shaped core 122 that have been opened. By closing the opened housing 131 in this state, the wire 105a is simultaneously clamped by the first ring-shaped core 112 and the second ring-shaped core 122 that have been closed, that is, the wire 105a is clamped by the clamp unit 102. In this state, the wire 105a functions as a one-turn coil for the first ring-shaped core 112 and the second ring-shaped core 122.

As shown in FIG. 16, the appliance main unit 104 includes a D/A converter unit 141, a power amplifier unit 142, a current detecting unit 143, a switch 144, a wave detection unit 145, a first A/D converter unit 146 (hereinafter simply referred to as the "A/D converter unit 146"), an amplifier unit 147, a second A/D converter unit 148 (hereinafter, simply referred to as the "A/D converter unit 148"), a processing unit 149, an output unit 150, and an operation unit 151. In this case, the D/A converter unit 141, the power amplifier unit 142, and the injection clamp unit 111 construct a voltage injection unit 161. The current detecting unit 143, the wave detection unit 145, and the first A/D converter unit 146 construct a test current detecting unit 162 that detects a test current Ix (which forms part of an AC current flowing in the measured circuit 105) flowing in the measured circuit 105 due to the injection of a test AC voltage Vx, described later. Also, the current detecting unit 143, the amplifier unit 147, and the A/D converter unit 148 construct a noise current detecting unit 163 that detects a noise current In (which also forms part of the AC current flowing in the measured circuit 105) flowing in the measured circuit 105. One example of the noise current In is a current generated due to a commercial power supply.

The D/A converter unit 141 converts AC waveform data Dv outputted from the processing unit 149 at a predetermined conversion rate to an AC voltage Va which is outputted. Here, the AC waveform data Dv is composed of waveform data so that the AC voltage Va is an AC signal with a certain frequency and a certain amplitude. The power amplifier unit 142 amplifies the AC voltage Va with a predetermined gain to generate the AC voltage V1 with an amplitude set in advance and applies the generated AC voltage V1 to the first coil 113 of the injection clamp unit 111. By doing so, the test AC voltage Vx is injected via the injection clamp unit 111 into the measured circuit 105. In this case, since the wire 105a functions in the present embodiment as a one-turn coil for the first ring-shaped core 112, the test AC voltage Vx injected into the measured circuit 105 has a voltage value obtained by dividing the AC voltage V1 by the number of turns N1 (Vx=V1/N1).

Since the wire 105a functions as a one-turn coil for the second ring-shaped core 122, the detection clamp unit 121 detects an AC current flowing in the measured circuit 105 (a test current Ix flowing in the measured circuit 105 due to the injection of the test AC voltage Vx and the noise current In) and outputs a detection current I1 (=(Ix+In)/N2) to the second coil 123. The current detecting unit 143 converts the detection current I1 to an AC voltage Vb and outputs the AC voltage Vb. The switch 144 receives an input of the AC voltage Vb and is subjected to switching control by the processing unit 149 to output the AC voltage Vb to one of the test current detecting unit 162 and the noise current detecting unit 163.

The wave detection unit 145 carries out synchronous detection on the AC voltage Vb using a wave detection signal Sd (a clock signal synchronized with the AC voltage Va) outputted from the processing unit 149 and outputs an AC voltage Vc with the same frequency as the AC voltage Va. The A/D converter unit 146 converts the AC voltage Vc to digital data and outputs such data as the current data Di1. Here, the synchronous detection carried out using the wave detection signal Sd removes the noise current In component included in the detection current I1 and thereby extracts the test current Ix component. This means that the current data Di1 outputted from the A/D converter unit 146 is data showing the test current Ix.

The amplifier unit 147 amplifies the voltage of the AC voltage Vb with a gain set in advance and outputs the result as an amplified voltage Vd. The A/D converter unit 148 converts the amplified voltage Vd to digital data and outputs such data as the current data Di2. Here, as described later, since the current data Di2 is measured in a state where the test AC voltage Vx is not being injected into the measured circuit 105 by the voltage injection unit 161, the current data Di2 is data showing the noise current In flowing in the measured circuit 105 due to the effects of external noise and the like.

The processing unit 149 includes a CPU and a memory (neither is shown), and executes an impedance calculating process (in the present embodiment, a resistance calculating process) and a noise current calculating process. As one example in the present embodiment, based on a control signal Scnt inputted from the operation unit 151, the processing unit 149 is capable of operating in a measurement mode which is one of an impedance measuring mode where an impedance calculating process is executed to measure a resistance value R1 of the measured circuit 105, a noise current measuring mode where a noise current calculating process is executed to measure the noise current In, and an alternating measurement mode where the impedance calculating process and the noise current calculating process are executed alternately. As one example, the output unit 150 is constructed as a display unit using a monitor apparatus and displays the results of the impedance calculating process and the noise current calculating process on a screen. Note that as a display unit, aside from a monitor apparatus, it is possible to construct the output unit 150 as, a printer apparatus. Also, aside from a display unit, it is possible to construct the output unit 150 as an interface circuit that is connected to an external storage apparatus and is capable of storing the results of the calculating processes in the external storage apparatus.

Figure 17:
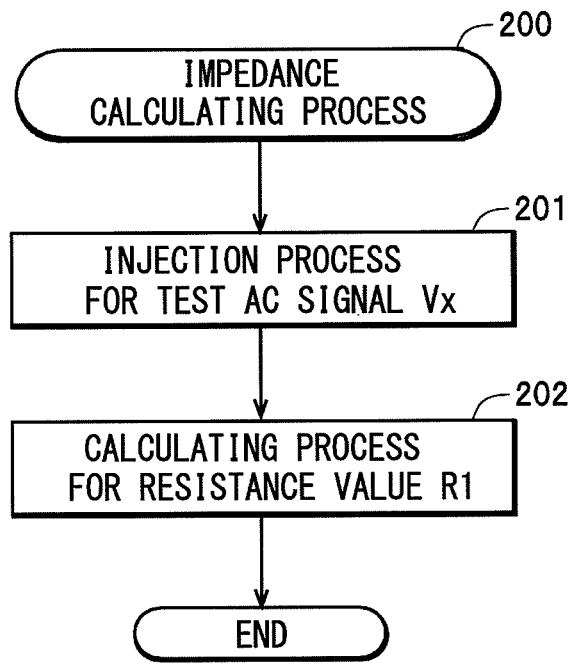
FIG. 17 is a flowchart useful in explaining an impedance calculating process carried out by a resistance measuring apparatus.
Figure 18:
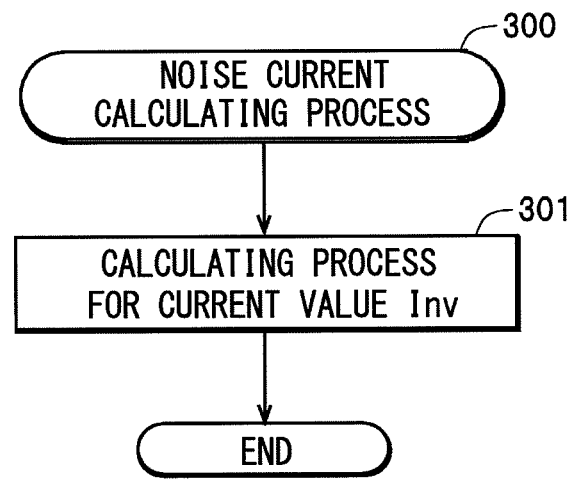
FIG. 18 is a flowchart useful in explaining a noise current calculating process carried out by the resistance measuring apparatus.
Figure 19:
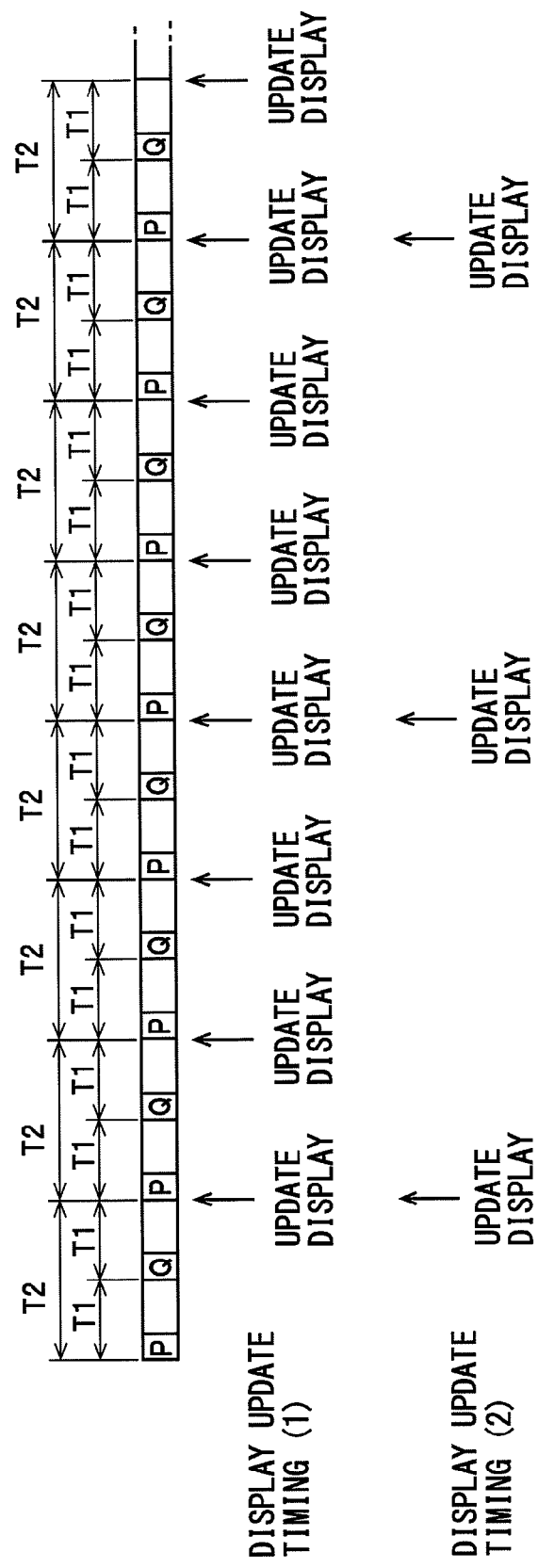
FIG. 19 is a timing chart useful in explaining the operation of the resistance measuring apparatus in an alternating measurement mode.

Next, the operation of the resistance measuring apparatus 101 will be described with reference to FIGS. 17, 18, and 19.

First, the case where the processing unit 149 operates in impedance measuring mode based on the control signal Scnt inputted from the operation unit 151 will be described.

In the impedance measuring mode, the processing unit 149 executes switching control over the switch 144 to switch the switch 144 so that the AC voltage Vb outputted from the current detecting unit 143 is inputted into the test current detecting unit 162 via the switch 144. After this, the processing unit 149 repeatedly executes an impedance calculating process (resistance calculating process) 200 shown in FIG. 17 (with a certain period that is set in advance) and updates the display of the resistance value R1 of the measured circuit 105 that has been measured on the output unit 150.

In the impedance calculating process 200, the processing unit 149 first executes the injection process that injects the test AC voltage Vx into the measured circuit 105 (step 201). More specifically, in the injection process, the processing unit 149 starts to output the AC waveform data Dv to the voltage injection unit 161. By doing so, in the voltage injection unit 161, the D/A converter unit 141 converts the AC waveform data Dv to the AC voltage (analog signal) Va which is outputted, and the power amplifier unit 142 amplifies the AC voltage Va to produce the AC voltage V1 and applies the AC voltage V1 to the first coil 113 of the injection clamp unit 111. By doing so, the test AC voltage Vx is injected from the injection clamp unit 111 into the measured circuit 105. As a result, an AC current that includes the noise current In and also the test current Ix generated due to the injection of the test AC voltage Vx flows in the measured circuit 105. The processing unit 149 starts to output the AC waveform data Dv and simultaneously starts to output the wave detection signal Sd that is synchronized to the AC voltage Va to the wave detection unit 145.

In the state where the test AC voltage Vx is being injected into the measured circuit 105, the detection clamp unit 121 detects the AC current flowing in the measured circuit 105, the detection current I1 is outputted from the second coil 123, and the current detecting unit 143 converts the detection current I1 to the AC voltage Vb which is outputted. The AC voltage Vb is inputted via the switch 144 into the test current detecting unit 162.

The test current detecting unit 162 executes a process that generates the current data Di1 showing the current value of the detection current I1. More specifically, in the test current detecting unit 162, the wave detection unit 145 carries out synchronous detection on the AC voltage Vb using the wave detection signal Sd and outputs an AC voltage Vc composed of the same frequency component as the AC voltage Va. Next, the A/D converter unit 146 converts the AC voltage Vc to the digital data and outputs such data as the current data Di1 to the processing unit 149.

After this, the processing unit 149 executes a calculating process that calculates the resistance value R1 of the measured circuit 105 (step 202). More specifically, in the calculating process, the processing unit 149 calculates the test AC voltage Vx based on the amplitude of the AC voltage V1 and the number of turns (N1) of the first coil 113 and calculates the test current Ix based on the detection current I1 specified by the current data Di1 and the number of turns (N2) of the second coil 123. The processing unit 149 also calculates the resistance value R1 of the measured circuit 105 based on the calculated test AC voltage Vx and the test current Ix and stores the resistance value R1 in the memory. When calculating the resistance value R1, the processing unit 149 may use a construction that calculates the resistance value R1 multiple times, calculates an average (as one example, a moving average) of such values, and sets the average as the final resistance value R1 or may use a construction where a resistance value R1 found in one calculation is set as the final resistance value R1. By doing so, the impedance calculating process 200 is completed.

In impedance measuring mode, the processing unit 149 executes the impedance calculating process 200 described above in each fixed period described above and updates the display of the calculated (measured) resistance value R1 on the screen of the display unit used as the output unit 150.

Next, the case where the processing unit 149 is operating in the noise current measuring mode based on the control signal Scnt inputted from the operation unit 151 will be described.

In the noise current measuring mode, the processing unit 149 executes switching control over the switch 144 to switch the switch 144 so that the AC voltage Vb outputted from the current detecting unit 143 is inputted into the noise current detecting unit 163 via the switch 144. After this, the processing unit 149 repeatedly executes a noise current calculating process 300 shown in FIG. 18 (with a certain period that is set in advance (the same period as the impedance calculating process in the present embodiment, though this may be a different period)) and updates the display of the current value Inv of the noise current In flowing in the measured circuit 105 that has been measured on the output unit 150.

In the noise current calculating process 300, the processing unit 149 executes the calculating process for the current value Inv in a state where the injection process described above is stopped (step 301). More specifically, in the calculating process, since the processing unit 149 has stopped the outputting of the AC waveform data Dv to the voltage injection unit 161, the injecting of the test AC voltage Vx from the injection clamp unit 111 into the measured circuit 105 is not being carried out. This means that the AC current flowing in the measured circuit 105 detected by the detection clamp unit 121 is only the noise current In, and as a result, the detection clamp unit 121 detects the noise current In, the detection current I1 is outputted from the second coil 123 of the detection clamp unit 121, and the current detecting unit 143 converts the detection current I1 to the AC voltage Vb which is outputted. The AC voltage Vb is generated by converting the noise current In and is inputted via the switch 144 into the noise current detecting unit 163.

The noise current detecting unit 163 executes a process that generates the current data Di2 showing the current value of the detection current I1. More specifically, in the noise current detecting unit 163, first the amplifier unit 147 amplifies the AC voltage Vb with a gain set in advance and outputs the result as the amplified voltage Vd. Next, the A/D converter unit 148 converts the amplified voltage Vd to digital data and outputs such data as the current data Di2 to the processing unit 149.

In this state, the processing unit 149 calculates the current value Qnv of the noise current In based on the detection current I1 specified by the current data Di2 and the number of turns (N2) of the second coil 123 and stores the current value Qnv in the memory. When calculating the current value Qnv, the processing unit 149 may use a construction that calculates the current value Inv multiple times, calculates an average (as one example, a moving average) of such values, and sets the average as the final current value Inv, or may use a construction where the current value Inv found in one calculation is set as the final current value Inv. By doing so, the noise current calculating process 300 is completed.

In the noise current measuring mode, the processing unit 149 executes the noise current calculating process 300 described above in each certain period described above and updates the display of the calculated (measured) current value Inv on the screen of the display unit as the output unit 150.

Next, the case where the processing unit 149 is operating in the alternating measuring mode, where the impedance calculating process and the noise current calculating process are alternately executed, based on the control signal Scnt inputted from the operation unit 151 will be described.

In the alternating measuring mode, the processing unit 149 first executes switching control over the switch 144 with a certain period so that the AC voltage Vb outputted from the current detecting unit 143 is inputted via the switch 144 alternately into the test current detecting unit 162 and the noise current detecting unit 163. Next, in accordance with the switching timing of the AC voltage Vb, as shown in FIG. 19, in a period T1 (one example of a period set in advance, 250 ms) where the AC voltage Vb is being inputted into the test current detecting unit 162, the processing unit 149 executes the impedance calculating process 200 (shown by the symbol "P" in FIG. 19) to calculate the resistance value R1 and store the resistance value R1 in the memory, while in a next period T1 where the AC voltage Vb is being inputted into the noise current detecting unit 163, the processing unit 149 executes the noise current calculating process 300 (shown by the symbol "Q" in FIG. 19) to calculate the current value Inv and store the current value Inv in the memory. By doing so, as shown in FIG. 19, the processing unit 149 calculates a new resistance value R1 and a new current value Inv in period cycle T2 (=T1×2).

After this, at predetermined update timing, the processing unit 149 reads the newly calculated resistance value R1 and current value Inv from the memory and updates the display on the screen of the display unit as the output unit 150. In the present embodiment, as one example, this update timing is set in the processing unit 149 based on the control signal Scnt inputted from the operation unit 151. As the update timing, as shown in FIG. 19, it is possible to use update timing (1) that simultaneously updates the display of the resistance value R1 and the current value Inv in each period T2 where a new resistance value R1 and current value Inv are calculated (i.e., update timing where the resistance value R1 and the current value Inv are updated in each period T2), or to use update timing (2) where the display is updated in periods equal to multiples of the period T2 (in the example in FIG. 19, update timing where the resistance value R1 and the current value Inv are updated in periods equal to three times the period T2). Also, in the case of update timing (2), since the resistance value R1 and the current value Inv are calculated multiple times during one period for updating of the display, it is possible to use a construction that calculates the averages of such values and updates the display of the output unit 150 using such average values.

In this way, in the resistance measuring apparatus 101, in alternating measurement mode, by alternately executing the noise current calculating process 300 that calculates the current value Inv of the noise current In flowing in the measured circuit 105 based on the AC current flowing in the measured circuit 105 detected by the current detecting unit 143 in a state where the injecting of the test AC voltage Vx by the voltage injection unit 161 has been stopped and the impedance calculating process 200 with the period T1 set in advance, the processing unit 149 has the display of the current value Inv of the noise current In and the impedance (the resistance value R1 in the present embodiment) alternately updated on the screen of the display unit used as the output unit 150.

Accordingly, according to the resistance measuring apparatus 101, unlike an impedance measuring apparatus that has only the two measuring modes composed of the impedance measuring mode and the noise current measuring mode, by setting the alternating measurement mode described above (i.e., by causing the processing unit 149 to operate in alternating measurement mode), the impedance (in the present embodiment, the resistance value R1) and the current value Inv of the noise current In are alternately outputted on the output unit 150. This means that it is possible to confirm the impedance (in the present embodiment, the resistance value R1) and the current value Inv of the noise current In on the output unit 150 without having to manually switch between the impedance measuring mode and the noise current measuring mode (i.e., without having to manually switch the measuring mode).

Also, according to the resistance measuring apparatus 101, by using a construction where the output unit 150 is constructed as a display apparatus using a monitor apparatus for example and displaying the results of the impedance calculating process 200 and the noise current calculating process 300 (the impedance (resistance value R1) and the current value Inv of the noise current In) on the screen of the display unit, it is possible to easily and visually confirm the impedance (in the present embodiment, the resistance value R1) and the current value Inv of the noise current In without having to manually switch the measuring mode.

Note that although an example where the resistance calculating process is executed as one example of an impedance calculating process has been described, it is also possible to use a construction that specifies the voltage value of the test AC voltage Vx and the current value of the test current Ix based on the AC waveform data Dv outputted to the D/A converter unit 141 and the current data Di1 inputted from the A/D converter unit 146, specifies the phase difference between the test AC voltage Vx and the test current Ix, measures the impedance of the measured circuit 105 based on the specified values, and outputs (displays) the impedance together with the current value Inv of the noise current In.

Also, although an example where the newly calculated resistance value R1 and current value Inv are updated while being simultaneously displayed on the output unit 150 has been described above, in a case where the display area of the display unit is narrow, and in a case of a device that is capable of displaying numerals (for example, a seven-segment type display device) but has a number of digits that is incapable of simultaneously displaying the resistance value R1 and the current value Inv, it is possible to use a construction that alternately displays the resistance value R1 and the current value Inv on a single device while updating such values.

Also, although a construction where the test current Ix and the noise current In are detected by a single second coil 123 is used, though not shown, it is also possible to use a construction where the second ring-shaped core 122 is formed with a coil for detecting the test current Ix and a coil for detecting the noise current In and separate current detecting units are connected to the respective coils as a construction that omits the switch 144.

Also, although an example that detects the test current Ix flowing in the measured circuit 105 by synchronous detection has been described as the test current detecting unit 162 that uses the wave detection unit 145, it is possible to apply the present invention to a construction that uses a filter unit capable of selectively extracting a voltage component of a same frequency as the frequency of the test AC voltage Vx from the AC voltage Vb outputted from the current detecting unit 143 in place of the wave detection unit 145.

What is claimed is:

1. A measuring apparatus comprising:
a voltage injecting unit that injects a test AC signal into a measured circuit by applying an AC voltage to an injection coil;
a current detecting unit that uses a detection coil to detect an AC current flowing in the measured circuit due to injection of the test AC signal and outputs a detection signal whose amplitude changes in accordance with an amplitude of the AC current based on a current detection signal outputted from the detection coil;
a processing unit that calculates a current value of the AC current based on the detection signal and calculates at least one of a purely resistive component and a reactance component of the measured circuit as measurement values based on the calculated current value of the AC current and a voltage value of the injected test AC signal;
a first signal generating unit that generates and outputs a first signal that has a same period as a fundamental wave of the AC voltage and is synchronized with the fundamental wave of the AC voltage; and
a second signal generating unit that generates and outputs a second signal whose phase is perpendicular to the first signal,
wherein the current detecting unit carries out synchronous detection on the current detection signal using the first signal and outputs a first detection signal whose amplitude changes in accordance with an amplitude of a real component of the AC current as the detection signal and carries out synchronous detection on the current detection signal using the second signal and outputs a second detection signal whose amplitude changes in accordance with an amplitude of an imaginary component of the AC current as the detection signal, and
the processing unit executes:
a resistance value calculating process that calculates an absolute value of the current value of the AC current based on the first detection signal and the second detection signal and calculates an absolute value of an impedance of the measured circuit based on the calculated absolute value and the voltage value of the test AC signal;
a phase angle calculating process that calculates a phase angle between the AC current and the test AC signal based on the first detection signal and the second detection signal; and
a measurement value calculating process that calculates the measurement values based on the calculated absolute value of the impedance and the calculated phase angle.

2. The measuring apparatus according to claim 1,
wherein the voltage injecting unit includes a primary signal generating unit that generates an AC primary signal and a phase shift unit that generates two AC signals, whose phases are respectively perpendicular, based on the AC primary signal,
one AC signal out of the two AC signals is applied to the injection coil as the AC voltage,
the first signal generating unit generates the first signal based on the one AC signal out of the two AC signals generated by the voltage injecting unit, and
the second signal generating unit generates the second signal based on another AC signal out of the two AC signals generated by the voltage injecting unit.

3. The measuring apparatus according to claim 1,
wherein the first signal generating unit outputs the first signal in a state where the first signal is shaped into a rectangular wave,
the second signal generating unit outputs the second signal in a state where the second signal is shaped into a rectangular wave,
the current detecting unit includes an inverting unit that inverts the current detection signal and outputs the inverted current detection signal as an inverted detection signal and first and second switching units that input the current detection signal and the inverted detection signal and selectively output one of the current detection signal and the inverted detection signal,
the first switching unit carries out synchronous detection on the current detection signal by switching between and outputting the current detection signal and the inverted detection signal based on the first signal, and the second switching unit carries out synchronous detection on the current detection signal by switching between and outputting the current detection signal and the inverted detection signal based on the second signal.

4. The measuring apparatus according to claim 1, wherein the voltage injecting unit includes a memory, a CPU, a D/A converting circuit, and a power amplifier unit, a data table composed of digital data for an AC primary signal, digital data for the first signal whose phase matches the AC primary signal, digital data for the second signal whose phase is shifted by 90° with respect to the AC primary signal is stored in advance in the memory;

the CPU repeatedly executes an operation that successively reads the digital data for the AC primary signal, for the first signal, and for the second signal from the data table with a period set in advance, outputs the digital data for the AC primary signal to the D/A converter circuit, and generates the first signal and the second signal by outputting the digital data for the first signal and for the second signal from corresponding output ports, the D/A converter circuit converts the inputted digital data for the AC primary signal to a staircase wave and outputs the staircase wave as the AC primary signal, and the power amplifier unit generates the AC voltage based on the AC primary signal and applies the AC voltage to the injection coil.

5. The measuring apparatus according to claim 4, further comprising a filter that is disposed on an output side of the D/A converter circuit, removes a harmonic component included in the staircase wave and outputs the filtered staircase wave as the AC primary signal to the power amplifier unit.

6. The measuring apparatus according to claim 1, further comprising an operation unit and a display unit, wherein in accordance with an operation content for the operation unit, the processing unit selects one value out of the purely resistive component, the reactance component, an absolute value of the impedance, an inductance and a capacitance of the measured circuit respectively calculated based on the reactance component and a frequency of the AC voltage, and a phase angle calculated based on the first detection signal and the second detection signal, and has the display unit display the selected value.

7. The measuring apparatus according to claim 6, wherein the processing unit is operable when the calculated phase angle is outside a standard range set in advance, to have the display unit display a symbol indicating that the calculated phase angle is outside the standard range.

8. The measuring apparatus according to claim 1, further comprising an operation unit and a display unit including a main numeric display region and a sub numeric display region, wherein in accordance with an operation content for the operation unit, the processing unit selects two values out of the purely resistive component, the reactance component, an absolute value of the impedance, an inductance and a capacitance of the measured circuit respectively calculated based on the reactance component and a frequency of the AC voltage, and a phase angle calculated based on the first detection signal and the second detection signal, and displays the selected two values in the main numeric display region and the sub numeric display region.

9. The measuring apparatus according to claim 8, wherein the processing unit is operable when the calculated phase angle is outside a standard range set in advance, to have the display unit display a symbol indicating that the calculated phase angle is outside the standard range.

10. The measuring apparatus according to claim 1, further comprising an operation unit and a display unit including a main numeric display region and a sub numeric display region, wherein in accordance with an operation content for the operation unit, the processing unit selects one value out of the purely resistive component, the reactance component, and an absolute value of the impedance and displays the selected value in the main numeric display region, and selects one out of a value out of the purely resistive component, the reactance component, and the absolute value of the impedance aside from the selected value being displayed in the main numeric display region, an inductance and a capacitance of the measured circuit respectively calculated based on the reactance component and a frequency of the AC voltage, and a phase angle calculated based on the first detection signal and the second detection signal, and displays the selected value in the sub numeric display region.

11. The measuring apparatus according to claim 10, wherein the processing unit is operable when the calculated phase angle is outside a standard range set in advance, to have the display unit display a symbol indicating that the calculated phase angle is outside the standard range.

12. A measuring apparatus comprising:

a voltage injecting unit that injects a test AC signal into a measured circuit by applying an AC voltage to an injection coil;

a current detecting unit that uses a detection coil to detect an AC current flowing in the measured circuit due to injection of the test AC signal and outputs a detection signal whose amplitude changes in accordance with an amplitude of the AC current based on a current detection signal outputted from the detection coil;

a processing unit that calculates a current value of the AC current based on the detection signal and calculates at least one of a purely resistive component and a reactance component of the measured circuit as measurement values based on the calculated current value of the AC current and a voltage value of the injected test AC signal;

a first signal generating unit that generates and outputs a first signal that has a same period as a fundamental wave of the AC voltage and is synchronized with the fundamental wave of the AC voltage; and a second signal generating unit that generates and outputs a second signal whose phase is perpendicular to the first signal, wherein the current detecting unit carries out synchronous detection on the current detection signal using the first signal and outputs a first detection signal whose amplitude changes in accordance with an amplitude of a real component of the AC current as the detection signal and carries out synchronous detection on the current detection signal using the second signal and outputs a second detection signal whose amplitude changes in accordance with an amplitude of an imaginary component of the AC current as the detection signal, and the processing unit executes:
a resistance value calculating process that calculates an absolute value of the current value of the AC current based on the first detection signal and the second detection signal and calculates an absolute value of an impedance of the measured circuit based on the calculated absolute value and the voltage value of the test AC signal;
a ratio calculating process that calculates a value of a ratio of one out of an amplitude of the real component and an amplitude of the imaginary component to another out of the amplitude of the real component and the amplitude of the imaginary component for the AC current based on the first detection signal and the second detection signal; and
a measurement value calculating process that calculates the measurement values based on the calculated absolute value of the impedance and the calculated value of the ratio.

13. The measuring apparatus according to claim 12,
wherein the voltage injecting unit includes a primary signal generating unit that generates an AC primary signal and a phase shift unit that generates two AC signals, whose phases are respectively perpendicular, based on the AC primary signal,
one AC signal out of the two AC signals is applied to the injection coil as the AC voltage,
the first signal generating unit generates the first signal based on the one AC signal out of the two AC signals generated by the voltage injecting unit, and
the second signal generating unit generates the second signal based on another AC signal out of the two AC signals generated by the voltage injecting unit.

14. The measuring apparatus according to claim 12,
wherein the first signal generating unit outputs the first signal in a state where the first signal is shaped into a rectangular wave,
the second signal generating unit outputs the second signal in a state where the second signal is shaped into a rectangular wave,
the current detecting unit includes an inverting unit that inverts the current detection signal and outputs the inverted current detection signal as an inverted detection signal and first and second switching units that input the current detection signal and the inverted detection signal and selectively output one of the current detection signal and the inverted detection signal,
the first switching unit carries out synchronous detection on the current detection signal by switching between and outputting the current detection signal and the inverted detection signal based on the first signal, and
the second switching unit carries out synchronous detection on the current detection signal by switching between and outputting the current detection signal and the inverted detection signal based on the second signal.

15. The measuring apparatus according to claim 12,
wherein the voltage injecting unit includes a memory, a CPU, a D/A converting circuit, and a power amplifier unit,
a data table composed of digital data for an AC primary signal, digital data for the first signal whose phase matches the AC primary signal, digital data for the second signal whose phase is shifted by 90° with respect to the AC primary signal is stored in advance in the memory;
the CPU repeatedly executes an operation that successively reads the digital data for the AC primary signal, for the first signal, and for the second signal from the data table with a period set in advance, outputs the digital data for the AC primary signal to the D/A converter circuit, and generates the first signal and the second signal by outputting the digital data for the first signal and for the second signal from corresponding output ports,
the D/A converter circuit converts the inputted digital data for the AC primary signal to a staircase wave and outputs the staircase wave as the AC primary signal, and
the power amplifier unit generates the AC voltage based on the AC primary signal and applies the AC voltage to the injection coil.

16. The measuring apparatus according to claim 15,
further comprising a filter that is disposed on an output side of the D/A converter circuit, removes a harmonic component included in the staircase wave and outputs the filtered staircase wave as the AC primary signal to the power amplifier unit.

17. The measuring apparatus according to claim 12,
further comprising an operation unit and a display unit,
wherein in accordance with an operation content for the operation unit, the processing unit selects one value out of the purely resistive component, the reactance component, an absolute value of the impedance, an inductance and a capacitance of the measured circuit respectively calculated based on the reactance component and a frequency of the AC voltage, and a phase angle calculated based on the first detection signal and the second detection signal, and has the display unit display the selected value.

18. The measuring apparatus according to claim 17,
wherein the processing unit is operable when the calculated value of the ratio is outside a standard range set in advance, to have the display unit display a symbol indicating that the calculated value of the ratio is outside the standard range.

19. The measuring apparatus according to claim 12,
further comprising an operation unit and a display unit including a main numeric display region and a sub numeric display region,
wherein in accordance with an operation content for the operation unit, the processing unit selects two values out of the purely resistive component, the reactance component, an absolute value of the impedance, an inductance and a capacitance of the measured circuit respectively calculated based on the reactance component and a frequency of the AC voltage, and a phase angle calculated based on the first detection signal and the second detection signal, and displays the selected two values in the main numeric display region and the sub numeric display region.

20. The measuring apparatus according to claim 19,
wherein the processing unit is operable when the calculated value of the ratio is outside a standard range set in advance, to have the display unit display a symbol indicating that the calculated value of the ratio is outside the standard range.

21. The measuring apparatus according to claim 12,
further comprising an operation unit and a display unit including a main numeric display region and a sub numeric display region,
wherein in accordance with an operation content for the operation unit, the processing unit selects one value out of the purely resistive component, the reactance component, and an absolute value of the impedance and displays the selected value in the main numeric display region, and selects one out of a value out of the purely resistive component, the reactance component, and the absolute value of the impedance aside from the selected value being displayed in the main numeric display region, an inductance and a capacitance of the measured circuit respectively calculated based on the reactance component and a frequency of the AC voltage, and a phase angle calculated based on the first detection signal and the second detection signal, and displays the selected value in the sub numeric display region.

22. The measuring apparatus according to claim 21, wherein the processing unit is operable when the calculated value of the ratio is outside a standard range set in advance, to have the display unit display a symbol indicating that the calculated value of the ratio is outside the standard range.

23. A measuring apparatus comprising:
a voltage injecting unit that injects a test AC voltage into a measured circuit;
a current detecting unit that detects an AC current flowing in the measured circuit;
a test current detecting unit that detects a test current flowing in the measured circuit due to injection of the test AC voltage from the AC current detected by the current detecting unit while the test AC voltage is being injected by the voltage injecting unit;
a processing unit that executes an impedance calculating process calculating an impedance of the measured circuit based on the test AC voltage and the test current; and
an output unit,
wherein the processing unit alternately executes a noise current calculating process that calculates a noise current flowing in the measured circuit based on the AC current detected by the current detecting unit in a state where the injection of the test AC voltage by the voltage injecting unit is stopped and the impedance calculating process with a period set in advance to calculate the impedance and the noise current, and outputs the impedance and the noise current to the output unit.

24. The measuring apparatus according to claim 23, comprising a display unit as the output unit, wherein the impedance and the noise current outputted from the processing unit are updated and displayed on a screen of the display unit.

* * * * *